(12) United States Patent
Al-Qaq et al.

(10) Patent No.: US 11,516,054 B2
(45) Date of Patent: Nov. 29, 2022

(54) POLAR TRANSMITTER WITH FEEDTHROUGH COMPENSATION

(71) Applicant: Huawei Technologies Co., Ltd., Shenzhen (CN)

(72) Inventors: Wael Al-Qaq, Oak Ridge, NC (US); Xiaobao Yu, Shanghai (CN); Zhihang Zhang, Cary, NC (US); Min Yi, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/351,779

(22) Filed: Jun. 18, 2021

(65) Prior Publication Data
US 2021/0314204 A1    Oct. 7, 2021

Related U.S. Application Data

(63) Continuation of application No. PCT/CN2019/127246, filed on Dec. 21, 2019.

(60) Provisional application No. 62/784,099, filed on Dec. 21, 2018.

(51) Int. Cl.
  *H03C 3/00* (2006.01)
  *H03K 7/06* (2006.01)
  *H04L 27/12* (2006.01)
  *H04L 27/20* (2006.01)

(52) U.S. Cl.
  CPC .............................. *H04L 27/2092* (2013.01)

(58) Field of Classification Search
  CPC ........ H04L 27/2092; H03C 5/00; H03D 5/00; H03D 7/165

USPC .......................................................... 375/302
  See application file for complete search history.

(56) References Cited

U.S. PATENT DOCUMENTS

| 8,050,352 B2* | 11/2011 | Schell .................... H04L 27/361 332/149 |
| 8,803,627 B1* | 8/2014 | Xu .......................... H03C 3/095 331/16 |
| 2003/0215026 A1* | 11/2003 | Hietala ................. H04L 27/361 375/297 |
| 2004/0172438 A1 | 9/2004 | Gunzelmann |
| 2004/0229584 A1 | 11/2004 | Fischer et al. |

(Continued)

FOREIGN PATENT DOCUMENTS

CN    109314576 A    2/2019

OTHER PUBLICATIONS

John Groe, Sequoia Communications, Polar Transmitters for Wireless Communications, IEEE Communications Magazine • Sep. 2007 (Year: 2007).*

*Primary Examiner* — Tanmay K Shah
(74) *Attorney, Agent, or Firm* — Slater Matsil, LLP

(57) ABSTRACT

A circuit includes a polar transmitter to generate a radio frequency output from amplitude and phase signal components. The polar transmitter includes an amplifier to combine amplitude and phase signal components. A processor is coupled to the polar transmitter to provide the amplitude and phase signal components. The processor includes: a digital modulation circuit to generate a modulated digital signal including in-phase and quadrature signal components and a correction circuit to calculate and apply a complex digital offset for local oscillator feedthrough of the amplifier. The complex digital offset includes an in-phase offset correction factor and a quadrature offset correction factor.

21 Claims, 16 Drawing Sheets

(56) References Cited

U.S. PATENT DOCUMENTS

| | | | | |
|---|---|---|---|---|
| 2005/0094743 | A1* | 5/2005 | Rakib | H04L 27/364 375/302 |
| 2007/0188243 | A1* | 8/2007 | Waheed | H03L 7/101 331/16 |
| 2008/0074209 | A1* | 3/2008 | Ceylan | H03C 5/00 332/144 |
| 2009/0213972 | A1* | 8/2009 | Maunuksela | H03C 5/00 375/371 |

* cited by examiner

POLAR TRANSMITTER WITH FEEDTHROUGH COMPENSATION

CROSS-REFERENCE TO RELATED APPLICATIONS

This application is a continuation of International Application No. PCT/CN2019/127246, filed on Dec. 21, 2019, which claims priority to U.S. provisional patent application Ser. No. 62/784,099, filed on Dec. 21, 2018 and entitled "Polar Transmitter With Feedthrough Compensation", which is incorporated herein by reference as if reproduced in its entirety.

TECHNICAL FIELD

The disclosure generally relates to transmitters and to compensation used in transmitters.

BACKGROUND

Electronic circuits, including electronic circuits formed as integrated circuits (ICs) on semiconductor substrates, are used in a variety of applications including in communication systems. For example, a transmitter circuit may be formed of one or more integrated circuits formed on one or more silicon substrates and a receiver circuit may be formed of one or more integrated circuits formed on one or more silicon substrates. In some cases, transmitter and receiver circuits are formed on the same silicon substrate.

SUMMARY

According to one aspect of the present disclosure, there is provided a circuit that includes a polar transmitter to generate a radio frequency output from an amplitude signal component received at an amplitude input and a phase signal component received at a phase input. The polar transmitter includes an amplifier to combine amplitude and phase signal components. A processor is coupled to the polar transmitter to provide the amplitude signal component to the amplitude input and provide the phase signal component to the phase input. The processor includes: a digital modulation circuit to generate a modulated digital signal including an in-phase signal component and a quadrature signal component for conversion to the amplitude signal component and the phase signal component and a correction circuit to calculate a complex digital offset and apply the complex digital offset to correct the amplitude signal component and the phase signal component for LO feedthrough. The complex digital offset includes an in-phase offset correction factor and a quadrature offset correction factor. Applying a complex digital offset provides a fuller correction than using only a real offset and may be implemented using relatively simple components.

Optionally, in any of the preceding aspects, the processor includes a first Coordinate Rotation Digital Computer (CORDIC) to convert the in-phase signal component and the quadrature signal component to an initial amplitude signal component and an initial phase signal component.

Optionally, in any of the preceding aspects, the correction circuit includes a second CORDIC coupled to calculate a phase offset to the initial phase signal component.

Optionally, in any of the preceding aspects, the correction circuit further includes a multiplier to apply a gain correction factor and an adder to apply the in-phase offset correction factor, the multiplier and the adder between the first CORDIC and the second CORDIC.

Optionally, in any of the preceding aspects, the processor includes a Coordinate Rotation Digital Computer (CORDIC) to convert the in-phase signal component and the quadrature signal component to an initial amplitude signal component and an initial phase signal component in a first clock cycle, and calculate a phase offset and provide the phase offset to an adder to apply the phase offset to the initial phase signal component to generate the phase signal component in a second clock cycle.

Optionally, in any of the preceding aspects, the processor further includes a multiplier and an adder coupled to an output of the CORDIC, the multiplier to apply a gain correction factor and the adder to apply the in-phase offset correction factor to the initial amplitude signal component to generate an output.

Optionally, in any of the preceding aspects, the CORDIC is coupled to receive the output and generate the amplitude signal component in the second clock cycle.

Optionally, in any of the preceding aspects, the correction circuit includes a first Coordinate Rotation Digital Computer (CORDIC) to convert the modulated digital signal to a Sine component and a Cosine component, the correction circuit configured to apply correction to the Sine component and the Cosine component and generate a corrected in-phase signal component and a corrected quadrature signal component, the processor includes a second CORDIC to convert the corrected in-phase signal component and the corrected quadrature signal component to the amplitude signal component and the phase signal component.

Optionally, in any of the preceding aspects, the correction circuit includes a plurality of multipliers including a first multiplier to combine the in-phase offset correction factor and the Cosine component, a second multiplier to combine the in-phase offset correction factor and the Sine component, a third multiplier to combine the quadrature offset correction factor and the Cosine component, a fourth multiplier to combine the quadrature offset correction factor and the Sine component, a fifth multiplier to combine outputs of the first and fourth multipliers, and a sixth multiplier to combine outputs of the second and third multipliers.

Optionally, in any of the preceding aspects, the correction circuit further includes a seventh multiplier to combine the in-phase signal component and again factor, an eighth multiplier to combine outputs of the seventh multiplier and the fifth multiplier to generate the corrected in-phase signal component, a ninth multiplier to combine the quadrature signal component and the gain factor, and a tenth multiplier to combine the output of the ninth multiplier and the sixth multiplier to generate the corrected quadrature signal component.

According to one other aspect of the present disclosure, there is provided a method that includes: generating a modulated digital signal including an in-phase signal component and a quadrature signal component, converting the modulated digital signal to an amplitude signal component and a phase signal component, combining the amplitude signal component and the phase signal component in an amplifier to generate a radio frequency output, calculating a complex digital offset to digitally correct for LO feedthrough, the complex digital offset includes an in-phase offset correction factor and a quadrature offset correction factor, and applying the complex digital offset to correct the amplitude signal component and the phase signal component.

Optionally, in any of the preceding aspects, the quadrature offset correction factor is applied by a Coordinate Rotation Digital Computer (CORDIC) generating a phase offset and an adder combining the phase offset with the phase signal component.

Optionally, in any of the preceding aspects, converting the modulated digital signal to the amplitude signal component and the phase signal component is performed by a first CORDIC and the complex digital offset is applied by a second CORDIC coupled to receive the amplitude signal component from the first CORDIC.

Optionally, in any of the preceding aspects, the converting of the modulated digital signal to the amplitude signal component and the phase signal component is performed by a Coordinate Rotation Digital Computer (CORDIC) in a first clock cycle and the quadrature offset correction factor is applied by the CORDIC in a second clock cycle.

Optionally, in any of the preceding aspects, the method includes, in the first clock cycle, applying a gain correction factor and an in-phase correction factor to the amplitude signal component to generate an output, the CORDIC receiving the output and correcting the amplitude signal component in the second clock cycle.

Optionally, in any of the preceding aspects, the method further includes converting the modulated digital signal including the in-phase signal component and the quadrature signal component to Sine and Cosine components; applying the complex digital offset to the Sine and Cosine components; and converting the Sine and Cosine components back to in-phase and quadrature signal components.

Optionally, in any of the preceding aspects, converting the modulated digital signal to Sine and Cosine components is performed by a first CORDIC and generating the amplitude signal component and a phase signal component is performed by a second CORDIC.

According to still one other aspect of the present disclosure, there is provided a system including a polar transmitter formed on a substrate, the polar transmitter to generate a radio frequency output from an amplitude signal component received at an amplitude input and a phase signal component received at a phase input, the polar transmitter including a variable gain amplifier to combine the amplitude signal component and the phase signal component and a power amplifier to amplify output of the variable gain amplifier; an antenna coupled to receive the radio frequency output from the polar transmitter; a processor formed on the substrate, the processor coupled to the polar transmitter to provide the amplitude signal component to the amplitude input and to provide the phase signal component to the phase input, the processor comprising: a digital modulation circuit to generate a modulated digital signal including an initial in-phase signal component and an initial quadrature signal component for conversion to the amplitude signal component and the phase signal component; and a correction circuit to calculate a complex digital offset and apply the complex digital offset to correct the amplitude signal component and the phase signal component for local oscillator feedthrough of the variable gain amplifier, the complex digital offset includes an in-phase offset correction factor and a quadrature offset correction factor.

Optionally, in any of the preceding aspects, the system may further include one or more radio frequency receivers formed on the substrate, the one or more radio frequency receivers coupled to the antenna.

Optionally, in any of the preceding aspects, the system is embodied in user equipment to connect with a cellular network.

According to still one other aspect of the present disclosure, there is provided a circuit that includes a polar transmitter module to generate a radio frequency output from an amplitude signal component received at an amplitude input and a phase signal component received at a phase input, the polar transmitter including an amplifier to combine amplitude and phase signal components; a processor module to the polar transmitter to provide the amplitude signal component to the amplitude input and provide the phase signal component to the phase input, the processor comprising: a modulation module to generate a modulated digital signal including an in-phase signal component and a quadrature signal component for conversion to the amplitude signal component and the phase signal component; and a correction module to calculate a complex digital offset and apply the complex digital offset to correct the amplitude signal component and the phase signal component for local oscillator feedthrough of the amplifier, the complex digital offset includes an in-phase offset correction factor and a quadrature offset correction factor.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures (FIGS.) for which like references indicate elements.

DETAILED DESCRIPTION OF ILLUSTRATIVE EMBODIMENTS

The present disclosure will now be described with reference to the figures, which in general relate to polar transmitters that may be used in various communication devices, e.g. in wireless communication networks such as cellular telephone networks. Polar transmitters generate a radio frequency (RF) output from an amplitude signal component and a phase signal component, which may be generated digitally by a processor such as a digital baseband processor. These signal components may be combined by an amplifier (e.g. a variable gain amplifier) in a transmitter. In some cases, local oscillator feedthrough (phase signal feedthrough) in such an amplifier may provide a significant source of distortion in an RF signal.

In some examples, a correction circuit may correct for local oscillator feedthrough in a transmitter by calculating and applying a complex digital offset to correct the amplitude signal component and the phase signal component. The complex digital offset may include an in-phase offset correction factor and a quadrature offset correction factor. The correction circuit may be implemented digitally (e.g. in a digital baseband processor) and the in-phase and quadrature offset correction factors may be calculated as digital values. One or more Coordinate Rotation Digital Computer (CORDIC) may be used to apply correction. A CORDIC may also be used to transform a signal from cartesian components (e.g. in-phase and quadrature components) to polar components (e.g. amplitude and phase components). In some cases, the same CORDIC may be used for conversion from cartesian to polar and for applying a complex correction factor.

It is understood that the present embodiments of the disclosure may be implemented in many different forms and that claims scopes should not be construed as being limited to the embodiments set forth herein. Rather, these embodiments are provided so that this disclosure will be thorough and complete and will fully convey the inventive embodiment concepts to those skilled in the art. Indeed, the disclosure is intended to cover alternatives, modifications and equivalents of these embodiments, which are included within the scope and spirit of the disclosure as defined by the appended claims. Furthermore, in the following detailed description of the present embodiments of the disclosure, numerous specific details are set forth in order to provide a thorough understanding. However, it will be clear to those of ordinary skill in the art that the present embodiments of the disclosure may be practiced without such specific details.

Figure 1:
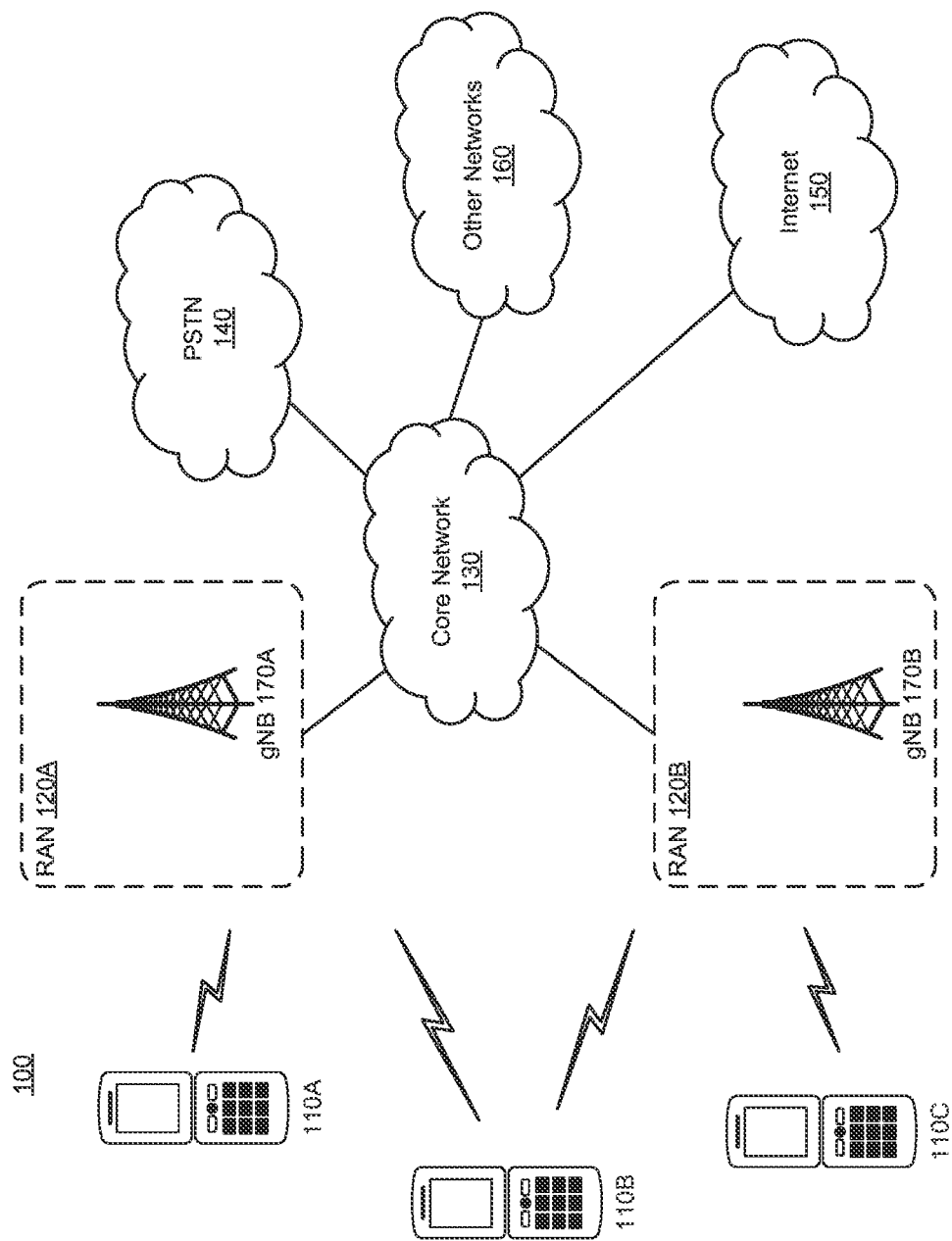
FIG. 1 illustrates an exemplary wireless network for communicating data.

FIG. 1 illustrates a wireless network for communicating data. The communication system 100 includes, for example, user equipment 110A-110C, radio access networks (RANs) 120A-120B, a core network 130, a public switched telephone network (PSTN) 140, the Internet 150, and other networks 160. Additional or alternative networks include private and public data-packet networks including corporate intranets. While certain numbers of these components or elements are shown in the figure, any number of these components or elements may be included in the system 100.

In one embodiment, the wireless network may be a fifth generation (5G) network including at least one 5G base station which employs orthogonal frequency-division multiplexing (OFDM) and/or non-OFDM and a transmission time interval (TTI) shorter than 1 ms (e.g. 100 or 200 microseconds), to communicate with the communication devices. In general, a base station may also be used to refer any of the eNB and the 5G BS (gNB). In addition, the network may further include a network server for processing information received from the communication devices via the at least one eNB or gNB.

System 100 enables multiple wireless users to transmit and receive data and other content. The system 100 may implement one or more channel access methods, such as but not limited to code division multiple access (CDMA), time division multiple access (TDMA), frequency division multiple access (FDMA), orthogonal FDMA (OFDMA), or single-carrier FDMA (SC-FDMA).

The user equipment (UE) 110A-110C are configured to operate and/or communicate in the system 100. For example, the user equipment 110A-110C are configured to transmit and/or receive wireless signals or wired signals. Each user equipment 110A-110C represents any suitable end user device and may include such devices (or may be referred to) as a user equipment/device, wireless transmit/receive unit (UE), mobile station, fixed or mobile subscriber unit, pager, cellular telephone, personal digital assistant (PDA), smartphone, laptop, computer, touchpad, wireless sensor, wearable devices or consumer electronics device.

In the depicted embodiment, the RANs 120A-120B include one or more base stations 170A, 170B (collectively, base stations 170), respectively. Each of the base stations 170 is configured to wirelessly interface with one or more of the UEs 110A, 110B, 110C to enable access to the core network 130, the PSTN 140, the Internet 150, and/or the other networks 160. For example, the base stations (BSs) 170 may include one or more of several well-known devices, such as a base transceiver station (BTS), a Node-B (NodeB), an evolved NodeB (eNB), a next (fifth) generation (5G) NodeB (gNB), a Home NodeB, a Home eNodeB, a site controller, an access point (AP), or a wireless router, or a server, router, switch, or other processing entity with a wired or wireless network.

In one embodiment, the base station 170A forms part of the RAN 120A, which may include other base stations, elements, and/or devices. Similarly, the base station 170B forms part of the RAN 120B, which may include other base stations, elements, and/or devices. Each of the base stations 170 operates to transmit and/or receive wireless signals within a particular geographic region or area, sometimes referred to as a "cell." In some embodiments, multiple-input multiple-output (MIMO) technology may be employed having multiple transceivers for each cell.

The base stations 170 communicate with one or more of the user equipment 110A-110C over one or more air interfaces (not shown) using wireless communication links. The air interfaces may utilize any suitable radio access technology.

It is contemplated that the system 100 may use multiple channel access functionality, including for example schemes in which the base stations 170 and user equipment 110A-110C are configured to implement the Long Term Evolution wireless communication standard (LTE), LTE Advanced (LTE-A), and/or LTE Multimedia Broadcast Multicast Service (MBMS). In other embodiments, the base stations 170 and user equipment 110A-110C are configured to implement UMTS, HSPA, or HSPA+ standards and protocols. Of course, other multiple access schemes and wireless protocols may be utilized.

The RANs 120A-120B are in communication with the core network 130 to provide the user equipment 110A-110C with voice, data, application, Voice over Internet Protocol (VoIP), or other services. As appreciated, the RANs 120A-120B and/or the core network 130 may be in direct or indirect communication with one or more other RANs (not shown). The core network 130 may also serve as a gateway access for other networks (such as PSTN 140, Internet 150, and other networks 160). In addition, some or all of the user equipment 110A-110C may include functionality for communicating with different wireless networks over different wireless links using different wireless technologies and/or protocols.

The RANs 120A-120B may also include millimeter and/or microwave access points (APs). The APs may be part of the base stations 170 or may be located remote from the base stations 170. The APs may include, but are not limited to, a connection point (an mmW CP) or a base station 170 capable of mmW communication (e.g., a mmW base station). The mmW APs may transmit and receive signals in a frequency range, for example, from 24 GHz to 100 GHz, but are not required to operate throughout this range. As used herein, the term base station is used to refer to a base station and/or a wireless access point.

Although FIG. 1 illustrates one example of a communication system, various changes may be made to FIG. 1. For example, the communication system 100 could include any number of user equipment, base stations, networks, or other components in any suitable configuration. It is also appreciated that the term user equipment may refer to any type of wireless device communicating with a radio network node in a cellular or mobile communication system. Non-limiting examples of user equipment are a target device, device-to-device (D2D) user equipment, machine type user equipment or user equipment capable of machine-to-machine (M2M) communication, laptops, PDA, iPad, Tablet, mobile terminals, smart phones, laptop embedded equipped (LEE), laptop mounted equipment (LME) and USB dongles.

Figure 2:
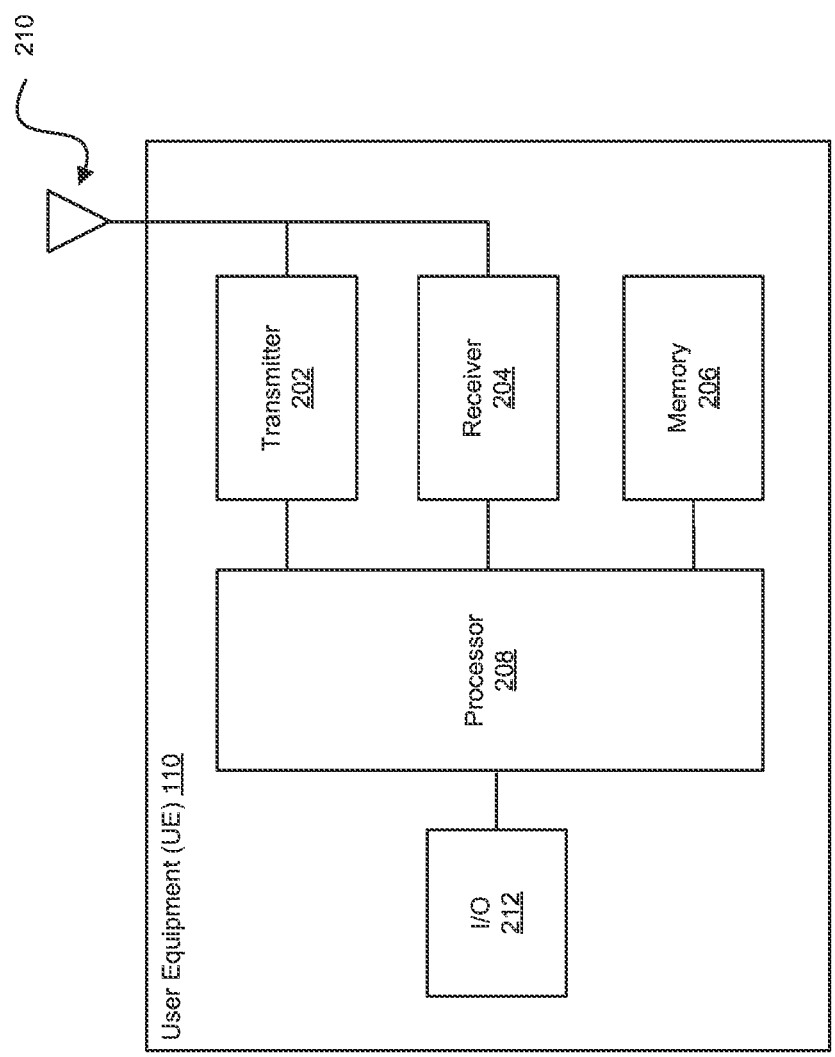
FIG. 2 illustrates exemplary details of an instance of user equipment (UE) introduced in FIG. 1.

FIG. 2 illustrates example details of an UE 110 that may implement the methods and teachings according to this disclosure. The UE 110 may for example be a mobile telephone but may be other devices in further examples such as a desktop computer, laptop computer, tablet, hand-held computing device, automobile computing device and/or other computing devices. As shown in the figure, the exemplary UE 110 is shown as including at least one transmitter 202, at least one receiver 204, memory 206, at least one processor 208, and at least one input/output device 212. The processor 208 can implement various processing operations of the UE 110. For example, the processor 208 can perform signal coding, data processing, power control, input/output processing, or any other functionality enabling the UE 110 to operate in the system 100 (FIG. 1). The processor 208 may include any suitable processing or computing device configured to perform one or more operations. For example, the processor 208 may include a microprocessor, microcontroller, digital signal processor, field programmable gate array, or application specific integrated circuit.

The transmitter 202 can be configured to modulate data or other content for transmission by at least one antenna 210. The transmitter 202 can also be configured to amplify, filter and a frequency convert RF signals before such signals are provided to the antenna 210 for transmission. The transmitter 202 can include any suitable structure for generating signals for wireless transmission.

The receiver 204 can be configured to demodulate data or other content received by the at least one antenna 210. The receiver 204 can also be configured to amplify, filter and frequency convert RF signals received via the antenna 210. The receiver 204 can include any suitable structure for processing signals received wirelessly. The antenna 210 can include any suitable structure for transmitting and/or receiving wireless signals. The same antenna, antenna 210, can be used for both transmitting and receiving RF signals, or alternatively, different antennas can be used for transmitting signals and receiving signals.

It is appreciated that one or multiple transmitters 202 could be used in the UE 110, one or multiple receivers 204 could be used in the UE 110, and one or multiple antennas 210 could be used in the UE 110. Although shown as separate blocks or components, at least one transmitter 202 and at least one receiver 204 could be combined into a transceiver. Accordingly, rather than showing a separate block for the transmitter 202 and a separate block for the receiver 204 in FIG. 2, a single block for a transceiver could have been shown.

The UE 110 further includes one or more input/output devices 212. The input/output devices 212 facilitate interaction with a user. Each input/output device 212 includes any suitable structure for providing information to or receiving information from a user, such as a speaker, microphone, keypad, keyboard, display, or touch screen.

In addition, the UE 110 includes at least one memory 206. The memory 206 stores instructions and data used, generated, or collected by the UE 110. For example, the memory 206 could store software or firmware instructions executed by the processor(s) 208 and data used to reduce or eliminate interference in incoming signals. Each memory 206 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

Figure 3:
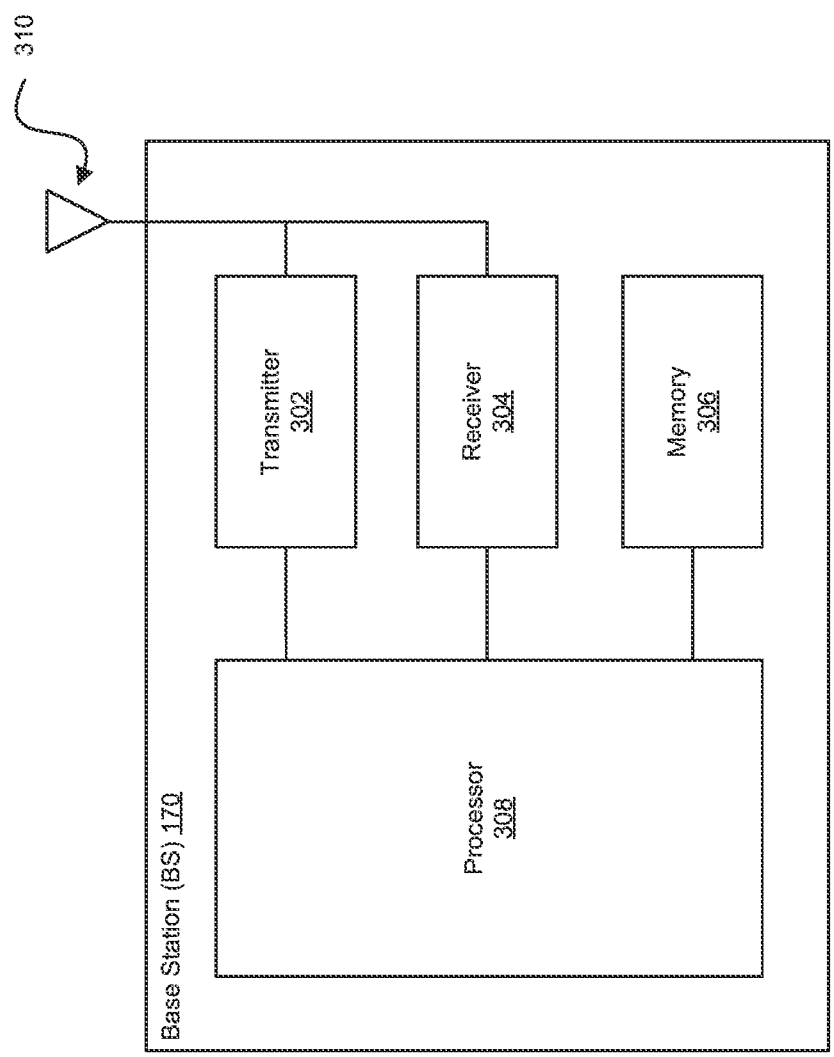
FIG. 3 illustrates exemplary details of an instance of a base station (BS) introduced in FIG. 1.

FIG. 3 illustrates an example BS 170 that may implement the methods and teachings according to this disclosure. As shown in the figure, the BS 170 includes at least one processor 308, at least one transmitter 302, at least one receiver 304, one or more antennas 310, and at least one memory 306. The processor 308 implements various processing operations of the BS 170, such as signal coding, data processing, power control, input/output processing, or any other functionality. Each processor 308 includes any suitable processing or computing device configured to perform one or more operations. Each processor 308 could, for example, include a microprocessor, microcontroller, digital signal processor, field programmable gate array, or application specific integrated circuit.

Each transmitter 302 includes any suitable structure for generating signals for wireless transmission to one or more UEs 110 or other devices. Each receiver 304 includes any suitable structure for processing signals received wirelessly from one or more UEs 110 or other devices. Although shown as separate blocks or components, at least one transmitter 302 and at least one receiver 304 may be combined into a transceiver. Each antenna 310 includes any suitable structure for transmitting and/or receiving wireless signals. While a common antenna 310 is shown here as being coupled to both the transmitter 302 and the receiver 304, one or more antennas 310 could be coupled to the transmitter(s) 302, and one or more separate antennas 310 could be coupled to the receiver(s) 304. Each memory 306 includes any suitable volatile and/or non-volatile storage and retrieval device(s).

The technology described herein can be implemented using hardware, software, or a combination of both hardware and software. The software used is stored on one or more of the processor readable storage devices described above to program one or more of the processors to perform the functions described herein. The processor readable storage devices can include computer readable media such as volatile and non-volatile media, removable and non-removable media. By way of example, and not limitation, computer readable media may comprise computer readable storage media and communication media. Computer readable storage media may be implemented in any method or technology for storage of information such as computer readable instructions, data structures, program modules or other data. Examples of computer readable storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. A computer readable medium or media does (do) not include propagated, modulated or transitory signals.

Communication media typically embodies computer readable instructions, data structures, program modules or other data in a propagated, modulated or transitory data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as RF and other wireless media. Combinations of any of the above are also included within the scope of computer readable media.

In alternative embodiments, some or all of the software can be replaced by dedicated hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), special purpose computers, etc. In one embodiment, software (stored on a storage device) implementing one or more embodiments is used to program one or more processors. The one or more processors can be in communication with one or more computer readable media/storage devices, peripherals and/or communication interfaces.

Figure 4A:
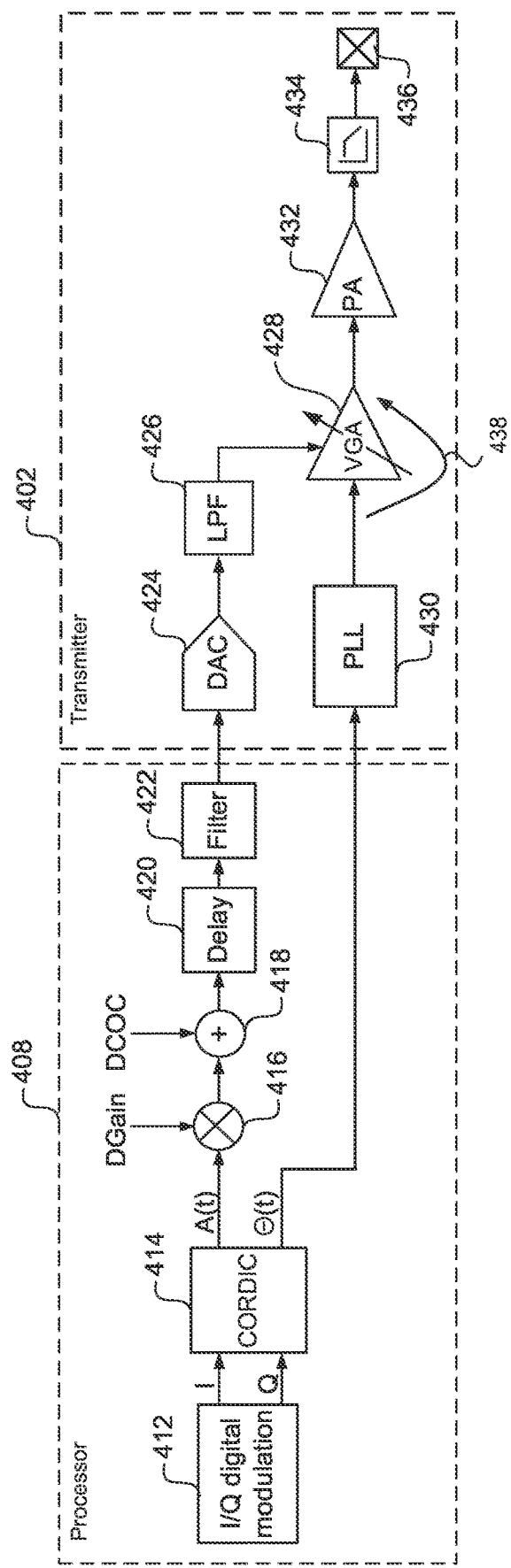
FIG. 4A illustrates exemplary details of a processor and transmitter.

FIG. 4A shows an example that includes a processor 408 (e.g. processor 208 of UE 110 or processor 308 of BS 170) coupled to transmitter 402 (e.g. transmitter 202 of UE 110 or transmitter 302 of BS 170) to generate an RF output (e.g. to antenna 210 or 310). Processor 408 (processor module) is a digital processor such as a digital baseband processor and includes various digital circuits including, but not limited to the components shown. Digital modulation circuit 412 (modulation module) generates a modulated digital signal including an in-phase signal component (I) and a quadrature signal component (Q), which are provided to a CORDIC 414 for conversion to an amplitude signal component A(t) and a phase signal component θ(t). The amplitude signal component A(t) (envelope amplitude) is scaled by multiplier 416, which multiplies amplitude signal component A(t) by a digital gain factor DGain, and by adder 418, which applies a digital DC offset correction DCOC. The amplitude signal component is then subject to a delay (for synchronization with phase signal component θ(t)) by delay element 420 and filtering by filter 422 before being output from processor 408 to an amplitude input of transmitter 402. The phase signal component θ(t) is provided directly to phase input of transmitter 402.

In transmitter 402 (polar transmitter module), the amplitude signal component is converted from a digital value to an analog signal by digital-to-analog converter, DAC 424. This analog signal is filtered by low pass filter, LPF 426, and is then used to control gain of a variable gain amplifier, VGA 428. Phase signal component θ(t) is provided to a phase-locked loop, PLL 430, which provides a phase modulated Local Oscillator (LO) signal to VGA 428. Thus, VGA 428 combines amplitude and phase signal components to provide an RF signal that is then amplified by power amplifier, PA 432, and is filtered by filter 434 before being provided as an RF output of transmitter 402 at terminal 436 (e.g. output to an antenna).

Figure 4B:
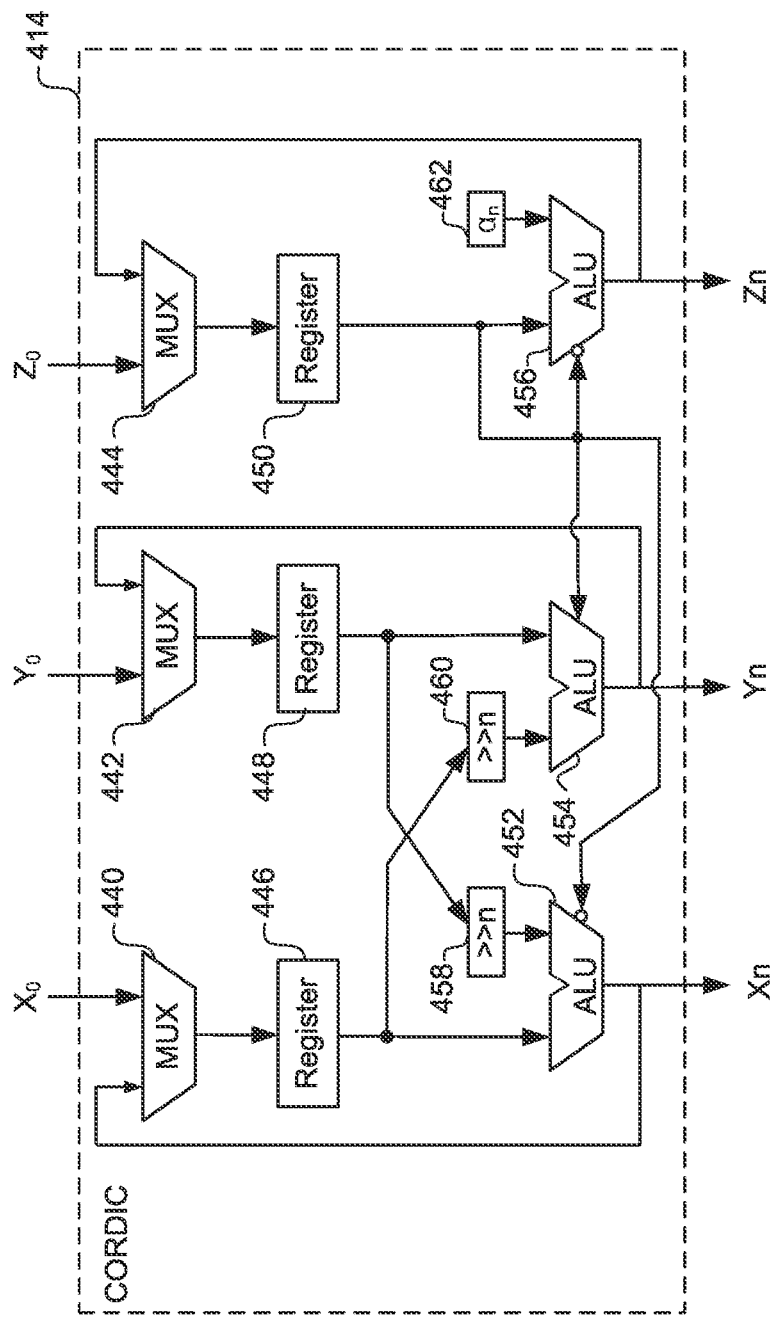
FIG. 4B illustrates exemplary details of a CORDIC.

CORDIC 414 may be implemented by dedicated circuits to perform the transformation from cartesian coordinates to polar coordinates, i.e. from I and Q to A and θ. A CORDIC is a well-known component used in digital circuits to compute various mathematical functions such as trigonometric functions. A CORDIC may be implemented using various hardware and the present technology is not limited to any particular hardware implementation. An example of a CORDIC, which may be used to implement CORDIC 414, is illustrated in FIG. 4B, including multiplexers, MUX 440, MUX 442, MUX 444, that receive inputs $X_o$, $Y_o$, $Z_o$ and provide outputs to registers 446, 448, 450 respectively, which in turn provide outputs to Arithmetic Logic Units, ALU 452, ALU 454, ALU 456 respectively. The output of register 446 is provided through bit shifter 458 to ALU 454 and the output of register 448 is provided through bit shifter 460 to ALU 452. Element 462 provides an input to ALU 456. Outputs of ALU 452, ALU 454, ALU 456 provide CORDIC outputs Xn, Yn, Zn respectively and are also fed back to MUX 440, MUX 442, MUX 444. Arithmetic Logic Units, ALU 452, ALU 454, ALU 456 may perform addition/subtraction so that CORDIC 414 performs shift and add operations in multiple iterations to generate outputs Xn, Yn, Zn. CORDIC 414 operates by using successive rotations. For example, given an X, Y input, the successive rotations on an input vector X+jY may attempt to zero out the Y component while keeping track of the number of rotations (iterations) performed and the phase applied per rotation. The final accumulated phase is the phase output of the CORDIC. In addition to transforming cartesian values (I and Q values) to polar values (A and θ values) as shown in FIG. 4A, CORDICs such as CORDIC 414 may be configured to perform a wide variety of other transformations.

In an ideal polar transmitter, the amplitude and phase are recombined in a VGA to reproduce the desired RF complex envelope signal (i.e. both amplitude and phase components are reproduced without distortion). This complex envelope signal is expressed in Eq. 1 below. Note that due to coupling through parasitics in a VGA such as VGA 428, the phase-modulated LO can leak (or feedthrough) without combining with the amplitude signal as shown by LO feedthrough 438 in FIG. 4A (LO feedthrough). Assuming VGA 428 is linear when the input signal amplitude is smaller, the complex envelope signal at the VGA output of a polar transmitter such as transmitter 402 can be described by the following simple equation, where the final term represents the local oscillator feedthrough component:

$$V_{out}(t) = \{RFGain * [DGain * A(t) + DCOC] + DC_{Env}\}e^{j[\theta(t)+\delta]} + \alpha e^{j[\theta(t)+\phi]} \quad \text{(Equation 1)}$$

Where:
RFGain: Total Analog+RF gain up to output of VGA 428
DCOC: Digital DC offset correction of the analog envelope path applied by adder 418
A(t): amplitude signal component for envelope modulation
θ(t): phase signal component for phase modulation
DGain: Digital gain used by multiplier 416 to scale the envelope modulation for a desired output power
$DC_{Env}$: Envelope DC offset of the analog/RF envelope path—corrected by DCOC
α: phase signal (LO) feedthrough amplitude of VGA 428
ϑ: phase of the desired polar signal
ø: phase of the LO feedthrough amplitude
Defining the difference between LO feedthrough and desired polar signal phase, phase delta, or Δφ, as $$\Delta\varphi = \varnothing - \vartheta$$

And given that DCOC and $DC_{Env}$ in the above equation are both real quantities, Equation 1 can be rewritten as:

$$V_{out}(t) = e^{j[\theta(t)+\vartheta]}\{RFGain * [DGain * A(t) + DCOC] + DC_{Env} + \alpha e^{j\Delta\varphi}\}$$

Ignoring the phase rotation term $e^{j\vartheta}$, this equation can be rewritten as:

$$V_{out}(t) = \qquad \text{(Equation 2)}$$
$$e^{j\theta(t)}\{RGain * [DGain * A(t) + DCOC] + DC_{Env} + \alpha e^{j\Delta\varphi}\}$$

Note that if the quantity Δφ=0 in Equation 2, then the DC offset generated in the analog/RF path is a real quantity ($DC_{Env}+\alpha$) and there is no imaginary component. This real DC offset can be cancelled by setting DCOC to an appropriate value given by the following:

$$DCOC = -\frac{DC_{Env} + \alpha}{RFGain}$$

However, in many real transmitters, the phase delta is not zero (Δφ≠0) as it is not easily controlled by design. In this case, the effective DC offset generated by the transmitter is complex and cannot simply be compensated by a real (or envelope) DC offset such as DCOC applied by adder 418. Moreover, the presence of a complex DC offset for a polar transmitter system like the one described by Eq. 2 above results in AMAM/AMPM distortion as the envelope signal swings lower in amplitude.

To see this, note that in the case where phase delta is not zero (Δφ≠0), Equation 2 above can be re-written as:

$$V_{out}(t) = \qquad \text{(Equation 2.1)}$$
$$e^{j[\theta(t)+\vartheta]}\{RFGain * [DGain * A(t) + DCOC] + DC_{Env} + \alpha\cos\Delta\varphi + j\alpha\sin\Delta\varphi\}$$

In this case, if the real envelope DC offset correction (DCOC) is set as follows:

$$DCOC = -\frac{DC_{Env} + \alpha\cos\Delta\varphi}{RFGain}$$

Then Equation 2.1 above becomes:

$$V_{out}(t) = e^{j\theta(t)}\{RFGain * DGain * A(t) + j\alpha \sin \Delta\varphi\}$$

Thus, the resulting AM-to-AM distortion is given by:

$$AMAM(t) = \sqrt{[RFGain * DGain * A(t)]^2 + [\alpha\sin\Delta\varphi]^2} \qquad \text{(Equation 3)}$$

And the resulting AM-to-PM distortion is given by:

$$AMPM(t) = \tan^{-1}\left(\frac{\alpha\sin\Delta\varphi}{RFGain * DGain * A(t)}\right)$$

Figure 5A:
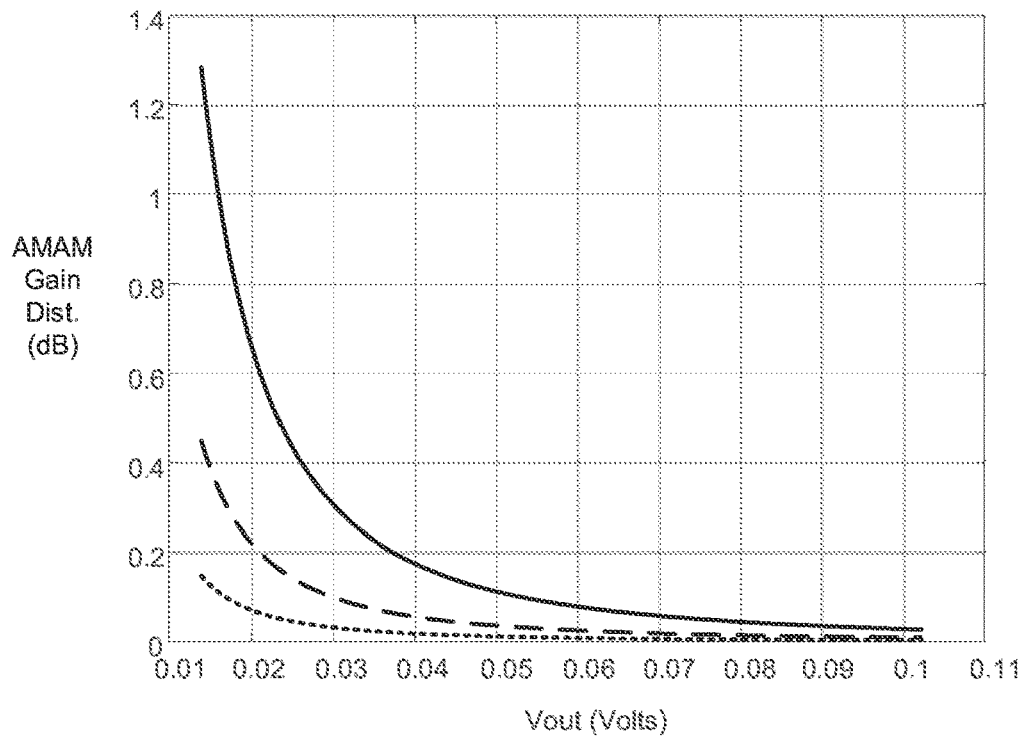
FIGS. 5A-B illustrate exemplary details of distortion due to LO feedthrough.
Figure 5B:
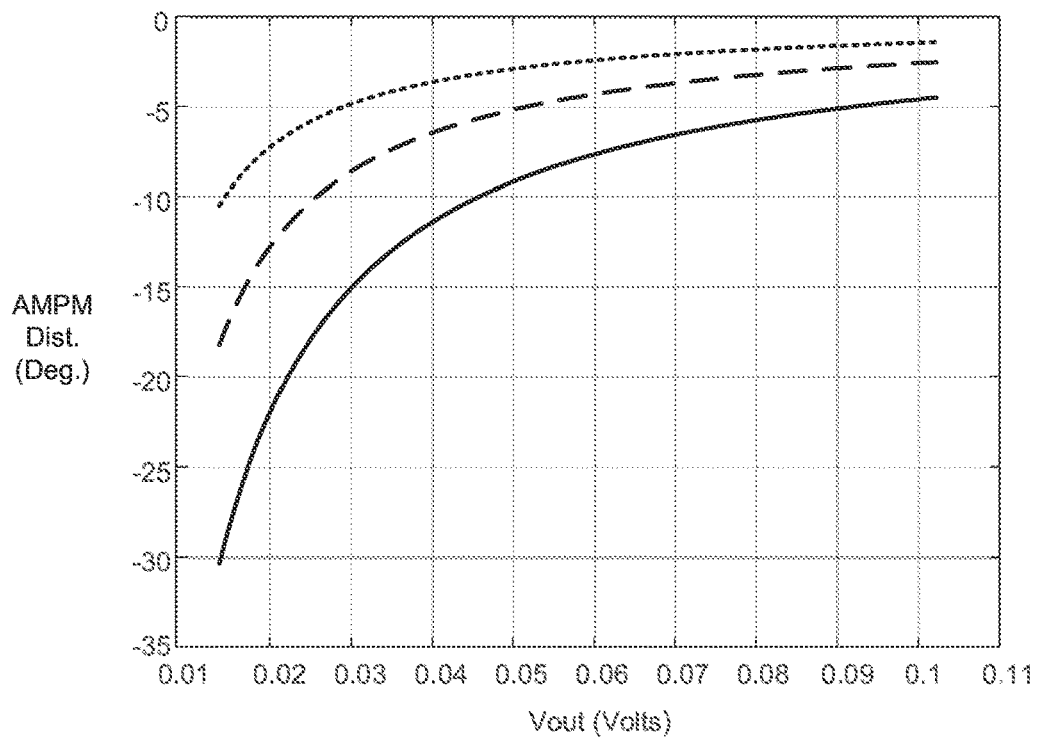

From Equations 3 and 4 above, it is clear that the amount of both AMAM and AMPM distortion is a function of the phase delta Δφ and the LO feedthrough (phase signal feedthrough) in dBc ($LO_{FT\_dBc}$) as defined by:

$$LO_{FT\_dBc} = 20\log\left(\frac{\alpha}{RFGain * DGainRMS\{A(t)\}}\right)$$

Where the term RMS{A(t)} indicates the root-mean-square (RMS) level of the envelope signal A(t). For example, for Enhanced Data rates for GSM Evolution (EDGE) modulation, the envelope signal swings 3.2 dB above and 14.2 dB below the RMS level. FIGS. 5A-B illustrate examples of the AMAM and AMPM distortion respectively due to LO phase signal component feedthrough as a function of voltage amplitude (Vout). As can be seen from FIGS. 5A-B, the local oscillator feedthrough in polar transmitter systems (e.g. in VGA 428 of transmitter 402) results in AMAM and AMPM distortion for lower voltage amplitude levels (i.e. more distortion on left of FIGS. 5A-B than on right. This distortion impacts the Error Vector Magnitude (EVM) and spectrum performance of a transmitter and may be particularly problematic for lower output power levels.

It can be understood from the above discussion that the use of a complex DC offset correction may enable the removal of LO feedthrough (phase feedthrough) in polar transmitters. In other words, applying a DC offset correction (DCOC) that is a complex quantity may provide a technical solution to the problem of distortion caused by local oscillator feedthrough in a polar transmitter. Such a complex offset correction factor has both in-phase and quadrature components and may be given by the following:

$$DCOC = DCOC_I + jDCOC_Q = -\left[\frac{DC_{Env} + \alpha e^{j\Delta\varphi}}{RFGain}\right] \qquad \text{(Equation 5)}$$

Using this to substitute DCOC in Equation 2, the digital signal may be expressed as:

$$V_{out}(t) = \qquad \text{(Equation 5.1)}$$
$$e^{j\theta(t)}\{RGain * [DGain * A(t) + DCOC_I + jDCOC_Q] + DC_{Env} + \alpha e^{j\Delta\varphi}\}$$

Figure 6:
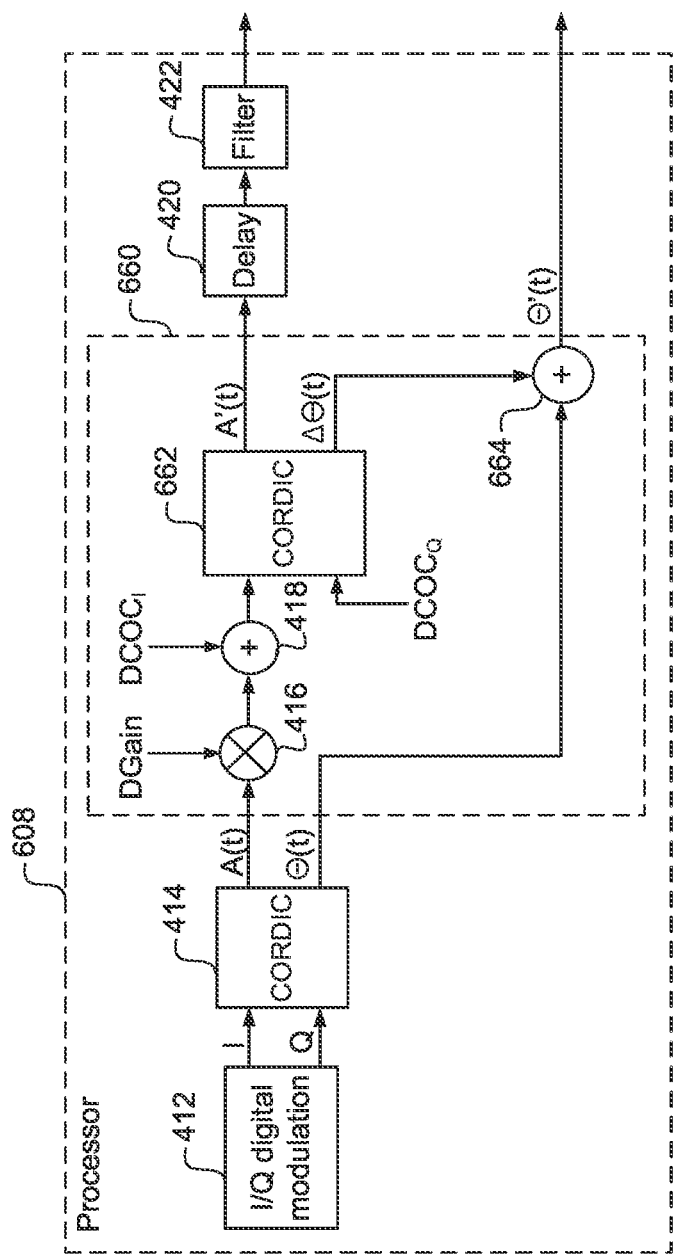
FIG. 6 illustrates exemplary details of a processor with a correction circuit.

FIG. 6 shows an embodiment that includes a processor 608 that provides an amplitude signal component and a phase signal component to respective inputs of a polar transmitter (e.g. transmitter 402) with compensation for local oscillator feedthrough using a complex correction factor that includes an in-phase correction factor and a quadrature correction factor. Processor 608 is a digital processor such as a digital baseband processor and includes various digital circuits including, but not limited to the components shown. Digital modulation circuit 412 generates a modulated digital signal including an in-phase signal component (I) and a quadrature signal component (Q), which are provided to CORDIC 414 (a first CORDIC) for conversion to an initial amplitude signal component A(t) and an initial phase signal component θ(t) as previously described (i.e. conversion from cartesian to polar coordinates). Initial amplitude signal component A(t) and initial phase signal component θ(t) are sent to a correction circuit 660 where initial amplitude signal component A(t) (envelope amplitude) is scaled by multiplier 416 (which multiplies initial amplitude signal component A(t) by digital gain factor DGain) and by adder 418 (which applies a digital in-phase offset correction DCOCI to obtain DGain*A(t)+ DCOCI) and is then provided as an input to CORDIC 662 (a second CORDIC). CORDIC 662 also receives a quadrature offset correction factor DCOCQ and from these inputs generates an amplitude signal component A'(t) and a phase offset Δθ(t). The amplitude signal component A'(t) is then subject to a delay (for synchronization) by delay element 420 and filtering by filter 422 before being output from processor 608 (e.g. to amplitude input of a transmitter such as transmitter 402). The phase offset Δθ(t) is added to the initial phase signal component θ(t) by adder 664 to generate phase signal component θ'(t), which is output from processor 608 (e.g. to a phase input of a transmitter such as transmitter 402).

Correction using correction circuit 660 (correction module) uses two parameters, in-phase offset correction factor DCOCI and quadrature offset correction factor DCOCQ. This simplifies the calibration procedure for lower transmitter polar powers compared with other solutions that may use digital predistortion tables that are made up of several lookup entries.

From FIG. 6, it is clear that the modified amplitude and phase required to compensate for LO feedthrough are respectively:

$$A'(t) = \sqrt{[DGain*A(t) + DCOC_I]^2 + DCOC_Q^2}$$

and $$\theta'(t) = \theta(t) + \tan^{-1}\left(\frac{DCOC_Q}{DGain*A(t) + DCOC_I}\right)$$

Where the phase offset calculated by CORDIC 662 is the second term in the above equation, i.e.

$$\Delta\Theta(t) = \tan^{-1}\left(\frac{DCOC_Q}{DGain*A(t) + DCOC_I}\right)$$

The outputs A'(t) and Δθ(t) can be generated by a CORDIC such as CORDIC 662 configured to perform corresponding transformations.

The example of FIG. 6 uses two CORDICS, a first CORDIC 414 to convert the in-phase signal component and the quadrature signal component to an initial amplitude signal component and an initial phase signal component (i.e. convert I and Q to A and θ) and second CORDIC 662 coupled to correct the initial amplitude signal component and the initial phase signal component. However, the technique illustrated does not necessarily require two separate CORDICs. By running a single CORDIC at twice the clock rate of other components in a transmitter, the same functionality can be realized as in processor 608 using a single CORDIC (e.g. without CORDIC 662). During a first clock phase, the CORDIC can calculate A(t) and θ(t) from the cartesian pair, I(t) and Q(t). In a second clock phase, the quantity DGain*A(t)+DCOCI+jDCOCQ is computed and re-applied to the same CORDIC to generate the amplitude signal component A'(t) and the phase signal component θ'(t).

Figure 7A:
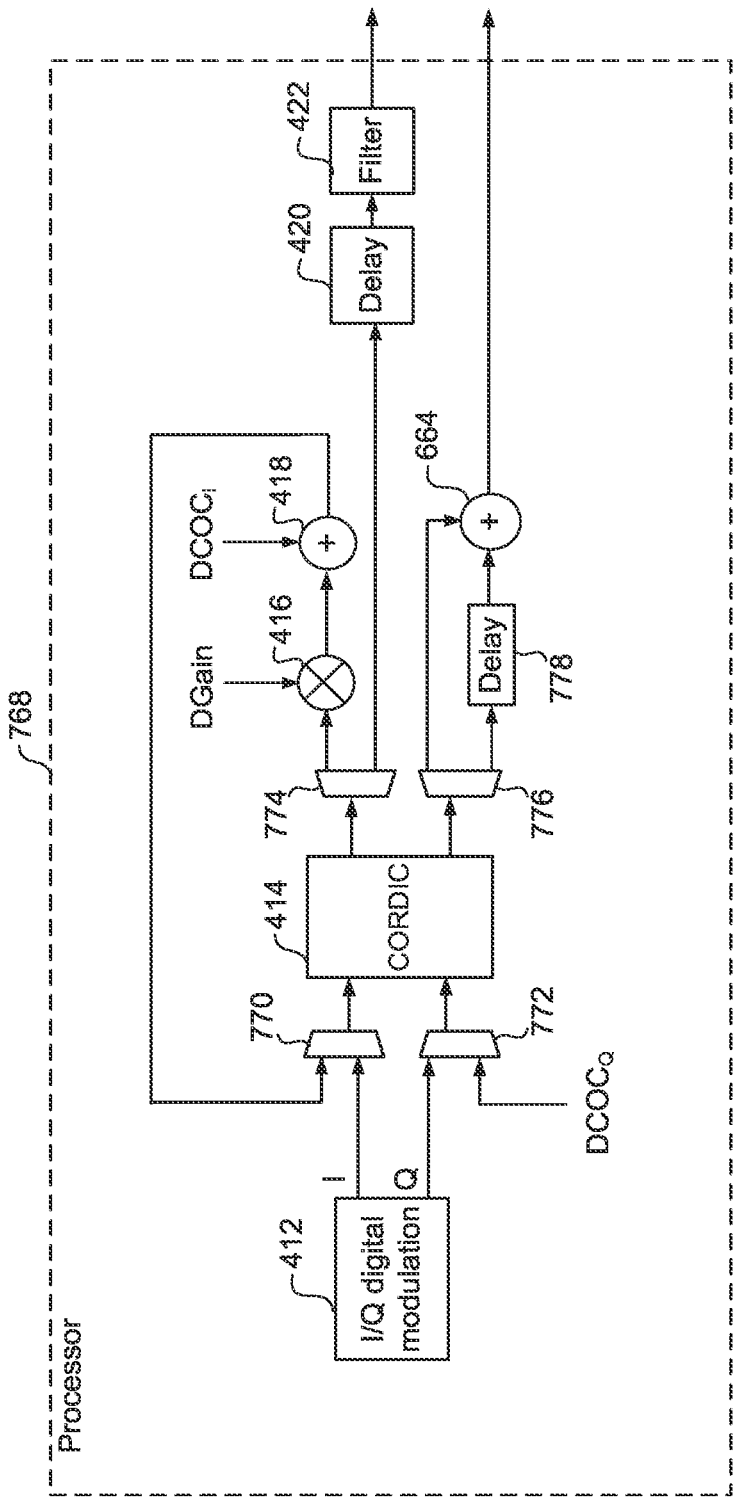
FIGS. 7A-C illustrates exemplary details of a processor configured to use a CORDIC in two clock phases.

FIG. 7A shows an example of a processor 768 using CORDIC 414 alone to perform the functions of both CORDIC 414 and CORDIC 662 that were described with respect to FIG. 6, i.e. converting the in-phase signal component and the quadrature signal component to an initial amplitude signal component and an initial phase signal component and also correcting the initial amplitude signal component and the initial phase signal component. Similar numbering is used for components that are common to processors 768 and 608. Digital modulation circuit 412 generates a modulated digital signal including an in-phase signal component (I) and a quadrature signal component (Q), which are provided through multiplexers, MUX 770 and MUX 772 respectively, to CORDIC 414. Outputs of CORDIC 414 are provided to demultiplexers, DEMUX 774 and DEMUX 776. A first output of DEMUX 774 is connected to multiplier 416, which is connected to adder 418, with the output from adder 418 provided as an input back to MUX 770. A second output of DEMUX 774 is connected through delay element 420 and filter 422 to provide a first output (e.g. amplitude signal component of processor 768 to a transmitter). A first output of DEMUX 776 is connected directly to adder 664. A second output of DEMUX 776 is connected through delay element 778 to adder 664, which provides a second output (e.g. phase signal component of processor 768 to a transmitter).

MUXs 770, 772 and DEMUXs 774, 776 are configured to switch input and output signals of CORDIC 414 from clock cycle to clock cycle and CORDIC performs different functions accordingly, converting the in-phase signal component and the quadrature signal component to an initial amplitude signal component and an initial phase signal component in a first clock cycle and correcting the initial amplitude signal component and the initial phase signal component in a second clock cycle.

Figure 7B:
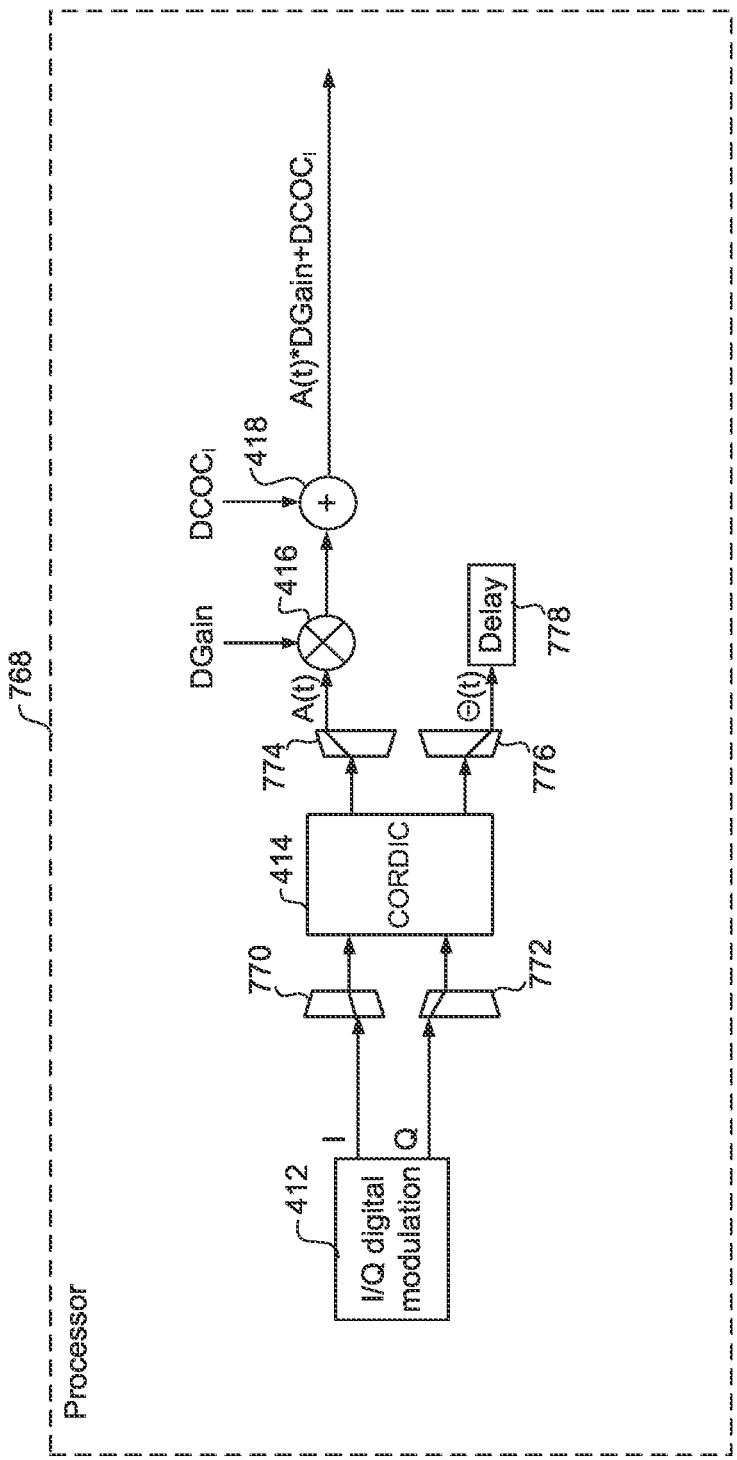

FIG. 7B shows an example of processor 768 during a first clock cycle with MUX 770 and MUX 772 providing in-phase and quadrature signal components, I and Q, to CORDIC 414 (components that are not active in this clock cycle are omitted for clarity). CORDIC 414 is configured to perform cartesian to polar conversion in this clock cycle to convert in-phase and quadrature signal components to initial amplitude and phase signal components A(t) and θ(t). DEMUX 774 provides initial amplitude signal component A(t) to multiplier 416 where it is multiplied by gain factor DGain. The output of multiplier 416 is sent to adder 418, which applies in-phase offset correction factor DCOCI to generate an output DGain*A(t)+DCOCI that is used in the second clock cycle. DEMUX 776 provides initial phase signal component θ(t) to delay element 778 for use in the second clock cycle.

Figure 7C:
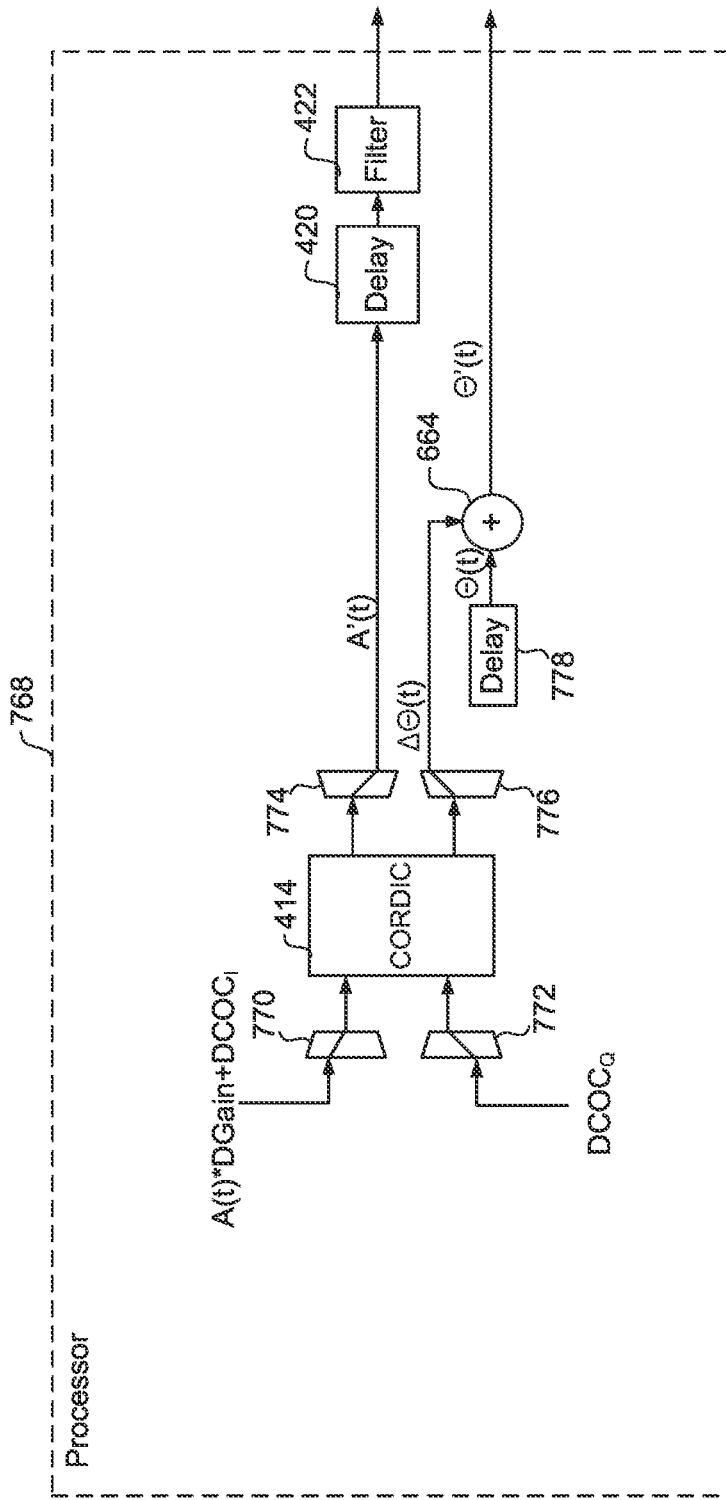

FIG. 7C shows processor 768 during the second clock cycle with MUX 770 providing input DGain*A(t)+DCOC$_I$ (from adder 418 as shown in FIG. 7B) to CORDIC 414 and shows MUX 772 providing quadrature offset correction factor $DCOC_Q$ to CORDIC 414 (components that are not active in this clock cycle are omitted for clarity). CORDIC 414 is configured to calculate amplitude signal component A'(t) and phase offset Δθ(t) from inputs DGain*A(t)+DCOCI and $DCOC_Q$ in this clock cycle, e.g. from $$A'(t) = \sqrt{[DGain * A(t) + DCOC_I]^2 + DCOC_Q^2} \quad \text{and}$$

$$\Delta\theta(t) = \tan^{-1}\left(\frac{DCOC_Q}{DGain * A(t) + DCOC_I}\right)$$

above. DEMUX 774 provides amplitude signal component A'(t) to through delay element 420 and filter 422 as an output (e.g. to a transmitter). DEMUX 776 provides phase offset Δθ to adder 664 where it is added to initial phase signal component θ(t) to generate phase signal component θ'(t), i.e. phase offset Δθ(t) is applied to initial phase signal component θ(t) to provide phase correction.

Figure 8:
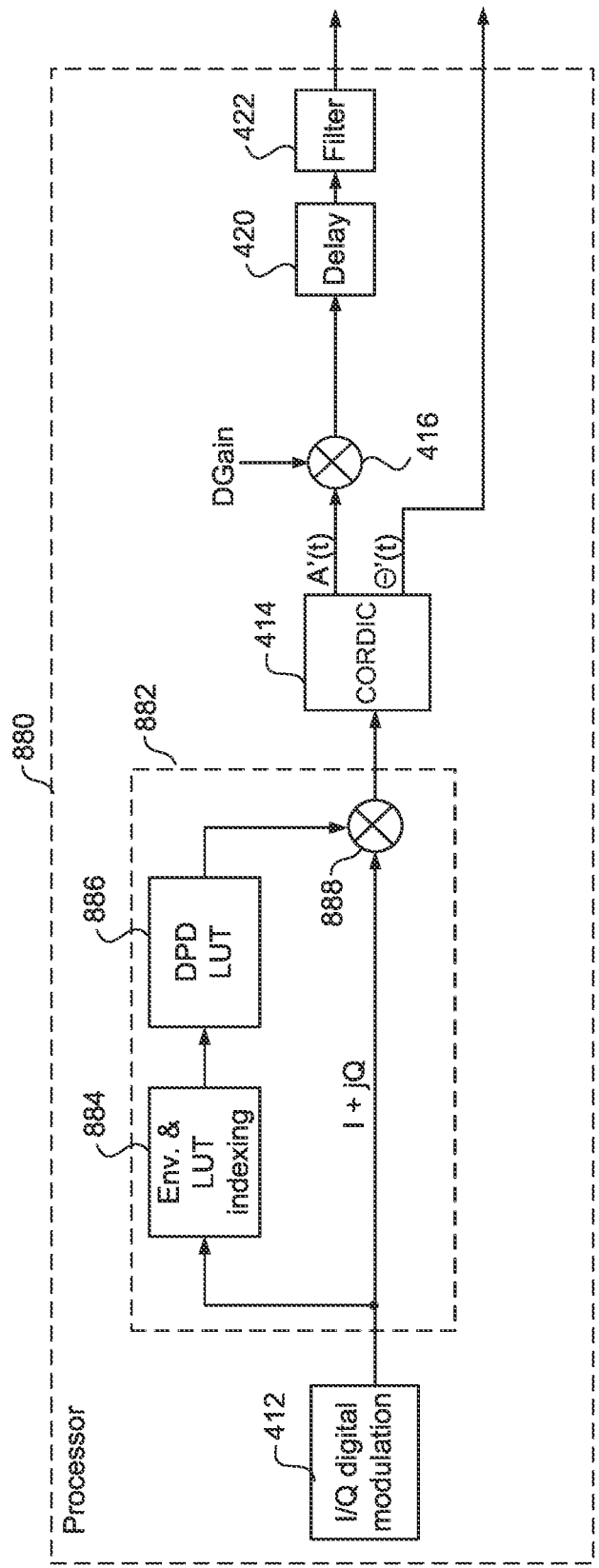
FIG. 8 illustrates an example of a processor with a correction circuit that includes a lookup table.

In other examples, digital correction may be provided to in-phase and quadrature signal components prior to conversion to amplitude and phase components (e.g. prior to CORDIC 414 in processor 408 in FIG. 4A) using a lookup table or otherwise. FIG. 8 shows an example of a processor 880, which includes digital modulation circuit 412 generating in-phase and quadrature signal components (I+jQ) for CORDIC 414. Between digital modulation circuit 412 and CORDIC 414 correction circuit 882 provides correction to the signal using envelope and LUT (lookup table) indexing circuit 884 in conjunction with a Digital Pre-Distortion Lookup Table circuit, DPD LUT 886. In-phase correction factors $DCOC_I$ and quadrature correction factors $DCOC_Q$ may be stored in DPD LUT 886 for a range of different amplitudes. Envelope and LUT indexing circuit 884 may generate an output that is used to find a corresponding entry in DPD LUT 886, i.e. to find corresponding in-phase and quadrature correction factors $DCOC_I$ and $DCOC_Q$ for a given amplitude. These in-phase and quadrature correction factors, DCOCI and DCOCQ, are then combined with in-phase and quadrature signal components I+jQ by multiplier 888. Corrected in-phase and quadrature signal components from multiplier 888 are then provided to CORDIC 414 and converted to corrected amplitude and phase signal components A'(t) and θ'(t). Corrected amplitude signal component A'(t) is then sent to multiplier 416, where further gain correction is applied. A DC offset is not applied after CORDIC 414 in this example because any appropriate offset is implemented prior to CORDIC 414 by correction circuit 882. While a gain correction factor such as DGain may be applied in correction circuit 882, it may also be applied by multiplier 416 as shown (although in some cases this is not done). Delay element 420 provides synchronization between amplitude signal component A'(t) and phase signal component θ'(t), with filter 422 filtering amplitude signal component A'(t) prior to output.

By rewriting the term [DGain*A(t)+$DCOC_I$+j$DCOC_Q$] in Equation 5.1 above, Equation 0.1 may be rewritten as:

$$V_{out}(t) = e^{j\theta(t)} \qquad \text{(Equation 5.2)}$$
$$\left\{ RGain * DGain * A(t)\left[1 + \frac{DCOC_I}{A(t) * DGain} + j\frac{DCOC_Q}{A(t) * DGain}\right] + DC_{Env} + \alpha e^{j\Delta\varphi} \right\}$$

Equation 5.2 may be used to populate a lookup table such as DPD LUT 886 according to an amplitude signal component A(t), where complex gain is a function of A(t) given by:

$$CG(A(t)) = 1 + \frac{DCOC_I}{A(t) * DGain} + j\frac{DCOC_Q}{A(t) * DGain}$$

It can be seen that entries of such a lookup table may be simply determined by three parameters: $DCOC_I$, $DCOC_Q$, and DGain. Thus DPD LUT 886 may be relatively simple and may be rapidly accessed. In some cases, a DPD LUT may compensate for other unwanted components of an RF output signal so that compensation for local oscillator feedthrough of an amplifier in a transmitter may be combined with compensation for other factors (e.g. compensation for distortion at high amplitudes caused by amplifier non-linearity). Thus, a single DPD LUT may be used to compensate for large signal distortion (e.g. from a power amplifier such as PA 432) and also compensate for small signal distortion (e.g. from LO feedthrough such as local oscillator feedthrough 438).

Figure 9:
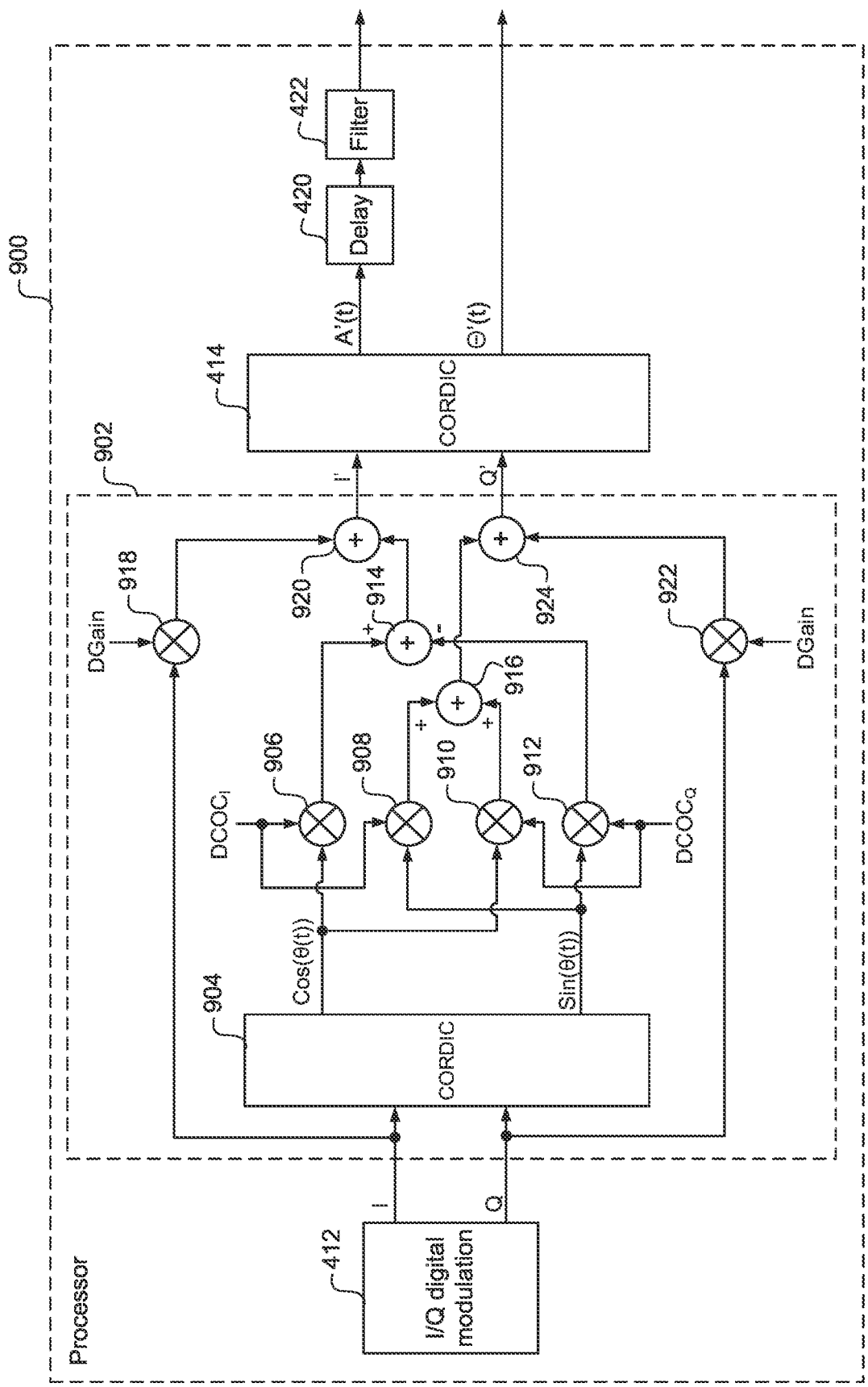
FIG. 9 illustrates an example of a processor with a correction circuit that includes a CORDIC to generate Cosine and Sine components.

An alternative implementation of a processor with correction for local oscillator feedthrough in a transmitter amplifier is shown in FIG. 9. Processor 900 includes digital modulation circuit 412 coupled through correction circuit 902 to CORDIC 414, with CORDIC 414 performing cartesian to polar transformation as before. In this example, correction is applied prior to conversion by CORDIC 414. Modulated in-phase and quadrature signal components I and Q are first converted to Cosine and Sine components, Cos (θ(t)) and Sin(θ(t)), by CORDIC 904, which may be implemented using similar hardware to CORDIC 414 (e.g. as shown in FIG. 4B) or otherwise. In some cases, a CORDIC (first CORDIC), which performs a relatively simple transformation to Cosine and Sine components may be implemented using a simpler circuit with fewer hardware components than in CORDIC 414. Correction circuit 902 is configured to apply correction to the Sine component and the Cosine component and generate a corrected in-phase signal component I' and a corrected quadrature signal component Q'. CORDIC 414 is configured to convert the corrected in-phase signal component I' and the corrected quadrature signal component Q' to the amplitude signal component A'(t) and the phase signal component θ(t).

Correction circuit 902 includes a plurality of multipliers including a first multiplier 906 to combine the in-phase offset correction factor $DCOC_I$ and the Cosine component Cos (θ(t)), a second multiplier 908 to combine the in-phase offset correction factor $DCOC_I$ and the Sine component Sin(θ(t)), a third multiplier 910 to combine the quadrature offset correction factor $DCOC_Q$ and the Cosine component Cos(θ(t)), a fourth multiplier 912 to combine the quadrature offset correction factor $DCOC_Q$ and the Sine component Sin(θ(t)), a first adder 914 to combine outputs of the first multiplier 906 and fourth multiplier 912 (subtracting output of fourth multiplier 912 from output of first multiplier 906), and a second adder 916 to combine outputs of the second multiplier 908 and third multiplier 910. Correction circuit 902 further includes a fifth multiplier 918 to combine the in-phase signal component I and a gain factor DGain, a third adder 920 to combine outputs of the fifth multiplier 918 and the first adder 914 to generate the corrected in-phase signal component I', a sixth multiplier 922 to combine the quadrature signal component Q and the gain factor DGain, and a fourth adder 924 to combine the output of the sixth multiplier 922 and the second adder 916 to generate the corrected quadrature signal component Q'. This arrangement provides corrected in-phase signal component I' according to the following equation:

$$I'(t)=DGain*I(t)+DCOC_I \cos(\theta(t))-DCOC_Q \sin(\theta(t))$$

and provides corrected quadrature signal component Q' according to the following equation:

$$Q'(t)=DGain*Q(t)+DCOC_I \sin(\theta(t))+DCOC_Q \cos(\theta(t))$$

Where I(t) and Q(t) represent the modulated in-phase and quadrature signal components from digital modulation circuit 412. An advantage of this design is its relative simplicity. No LUT may be needed (e.g. if a DPD LUT is not used for large signal predistortion compensation or other effect then adequate compensation may be provided by a correction circuit alone thereby simplifying hardware).

In order to apply correction factors, such as gain (e.g. DGain), in-phase offset correction factor (e.g. DCOCI), and quadrature offset correction factor (e.g. DCOCQ) for a given desired output power, some calibration may be performed. For example, distortion may be measured at one or more amplitudes (e.g. the system AMAM/AMPM distortion, as illustrated in FIGS. 5A-B, may be measured). This can be done by transmitting a variety of digital stimuli waveforms to help measure the system AMAM/AMPM. For example, a stepped-up DC or continuous wave (CW) stimulus or even a modulated waveform can be generated in a processor and transmitted through the transmitter and down converted back to in-phase and quadrature signal components (I and Q signal components) for AMAM/AMPM distortion measurement. For example, in one embodiment, a stepped-up DC stimulus A(t) can be transmitted and a linear measurement receiver (MRx) can be used to down convert the RF transmitted signal. The measurement receiver in-phase and quadrature (I and Q) data is then processed to generate the transmitter system AMAM/AMPM distortion data.

Figure 10:
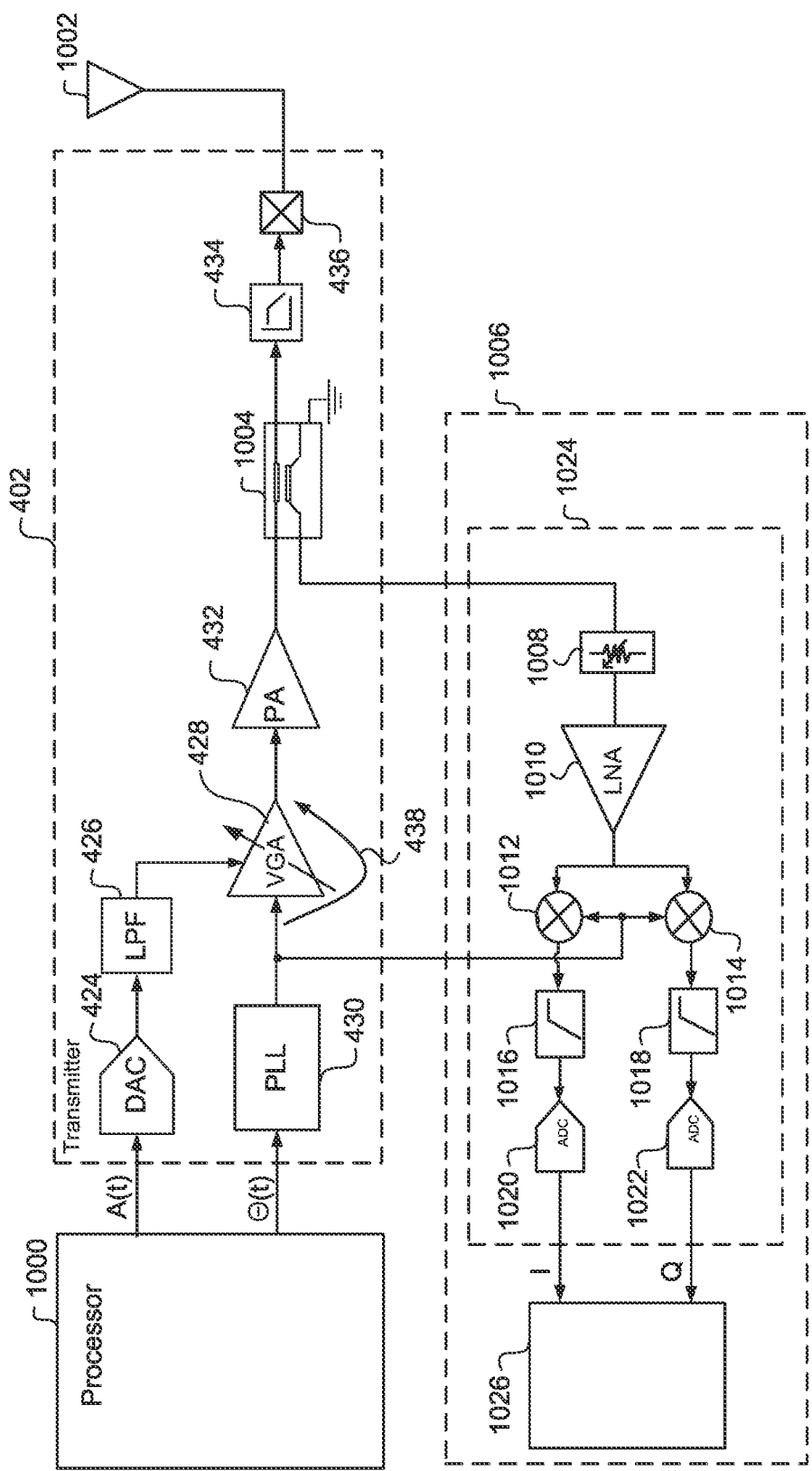
FIG. 10 illustrates an example of a transmitter coupled to a measurement system.

FIG. 10 shows an example of a processor 1000, e.g. a digital broadband processor such as processor 408, 608, 768, 880, 900, coupled to transmitter 402. Transmitter 402 provides an RF output to antenna 1002. Transmitter 402 includes components previously illustrated including DAC 424, LPF 426, PLL 430, VGA 428, PA 432, filter 434 and terminal 436. A coupler 1004 is inserted between PA 432 and filter 434 in this example to couple the RF signal from PA 432 to measurement system 1006. In measurement system 1006, the RF signal from coupler 1004 is provided to a measurement receiver 1024 where it is fed through attenuator 1008 to a Low Noise Amplifier, LNA 1010. In some cases, amplification may not be needed and LNA 1010 may be bypassed. The output of LNA 1010 is provided to mixers 1012, 1014 (e.g. receiver down-converting mixers used to generate receiver I and Q signal components). Mixers 1012, 1014 also receive Local Oscillator (LO) inputs from PLL 430 of transmitter 402. Mixers 1012, 1014 provide output signals through filters 1016, 1018 respectively. These signals are then converted to digital values by ADCs 1020, 1022 respectively. Thus, attenuator 1008, LNA 1010, mixers 1012, 1014, filters 1016, 1018, and ADCs 1020, 1022 form measurement receiver 1024, which uses the same PLL, PLL 430, as transmitter 402 so that the resulting receiver I and Q signal components are a complex DC representation of the AMAM/AMPM distortion of transmitter 402 (provided that measurement receiver 1024 is sufficiently linear). In-phase and quadrature components from measurement receiver 1024 are provided to analysis circuit 1026, which may include a processor configured to calculate AMAM/AMPM distortion from analysis of in-phase and quadrature signal components received from ADCs 1020, 1022.

Figure 11:
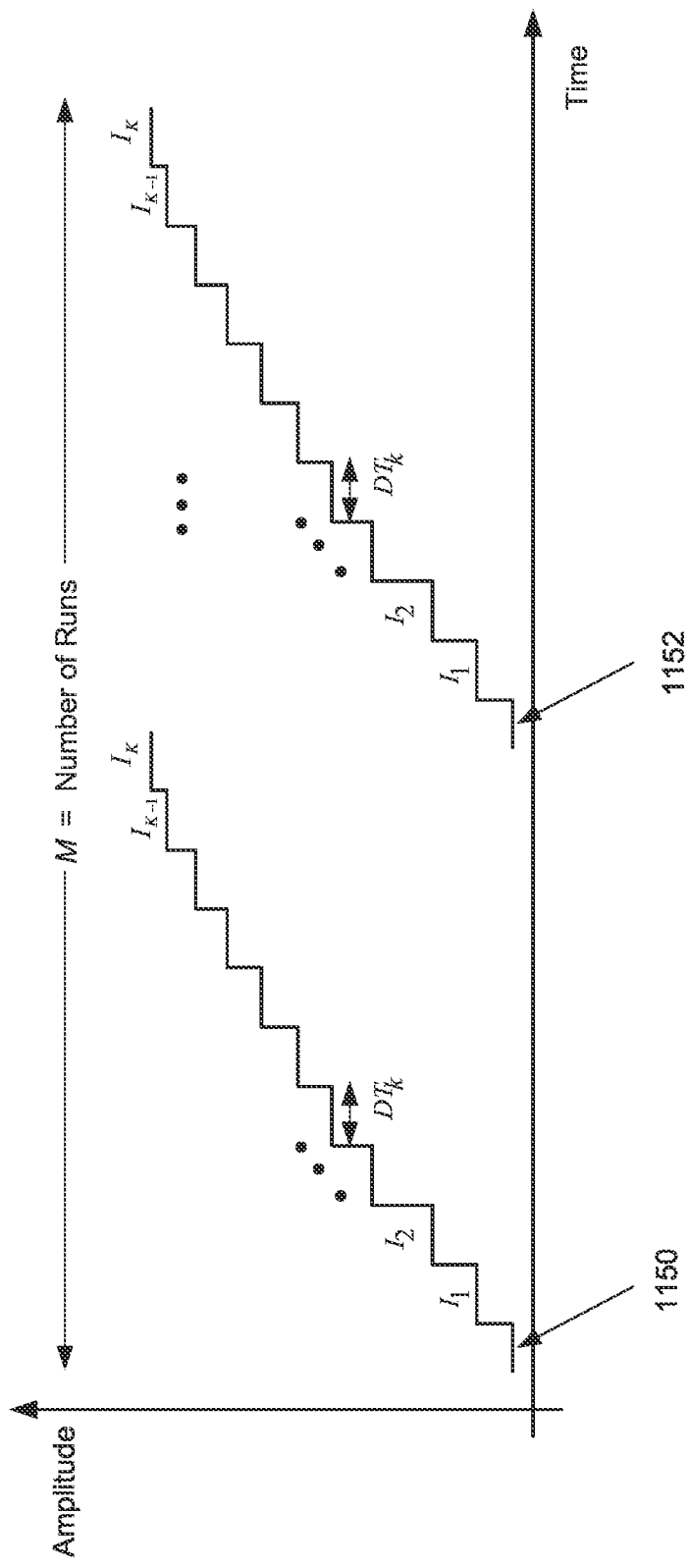
FIG. 11 illustrates an example of stimulus input for transmitter testing.

In an example of a calibration procedure, a digital modulation circuit of processor 1000 (e.g. digital modulation circuit 412) generates a stimulus, which may be repeated as many times as desired to average out measurement noise. FIG. 11 illustrates an example in which M runs (M ramp-up stimulus sequences) are performed to average out any potential measurement noise (two such runs are illustrated in the example of Figure ii). For each ramp-up stimulus sequence, there can be a total of K (uniform or non-uniform) steps (e.g. I1 to IK shown in FIG. 11) covering a certain dynamic range for a given transmitter gain setting (e.g. 40 dB for EDGE to cover top five Power Control Levels (PCLs)). Each step in the stimulus can have a programmable dwell time $DT_k$ as shown in FIG. 11.

For example, for 2G transmitter calibration, the following may be used: number of steps K=32, change per step $$\Delta k = \frac{40 \text{ dB}}{K},$$

dwell time per step $DT_k$=173 µs, number of runs M=16. If the final receiver processing sampling rate (e.g. sampling rate of ADCs 1020, 1022) is 7.68 MHz sampling rate, then $DT_k$=173 µs corresponds to N=1024 samples per step in the stimulus.

Initially, the transmitter output power may be observed with a spectrum analyzer (e.g. spectrum analyzer coupled to output of PA 432 of transmitter 402) and can be associated with the resulting receiver I/Q DC output value after choosing the optimal measurement receiver automatic gain control settings (MRx AGC), e.g. by appropriate setting of LNA 1010, attenuator 1008 and filter 1016 and applying the measurement receiver DC correction. The following steps may then be performed:

1. Prior to transmitting a stimulus (e.g. as shown in FIG. 11), the DC gain and offset values (in-phase and quadrature offset correction factors) in processor 1000 may be set as follows: DGain=1 and $DCOC_I$=$DCOC_Q$=0.

2. Immediately before transmitting each run of the stimulus (1, 2, ... M), e.g. at times 1150, 1152 of FIG. 11, the measurement receiver DC offset of measurement receiver 1024 may be re-measured with the AM path of transmitter 402 (through DAC 424 and LPF 426) disabled or maximally attenuated while measurement receiver 1024 is ON (e.g. by disabling VGA 428). PA 432 may also be disabled. This will isolate the measurement receiver path of measurement receiver 1024 from the transmitter path of transmitter 402 for a more accurate measurement receiver DC offset measurement. The DC measurement time is the programmable dwell time ($DT_k$). The DC offset of measurement receiver 1024 is simply measured by averaging the measurement receiver I/Q output as shown in the following equation:

$$\text{MRx\_DC}(m, k=0) = \sum_{n=0}^{N-1} I_{MRx}(m, 0, n) + jQ_{MRx}(m, 0, n), 1 \leq m \leq M$$

This measurement before the start of each stimulus is done to protect against slow MRx flicker noise drifting with time.

3. For the mth stimulus run (1≤m≤M) and with each stimulus run made of K steps ($I_k$, 1≤k≤K), the average complex DC value may be computed according to the following equation:

$$DC(m,k) = \sum_{n=0}^{N-1} I_{MRx}(m,k,n) + jQ_{MRx}(m,k,n), \ 1 \leq k \leq K, \ 1 \leq m \leq M$$

and then, the kth AMAM/AMPM responses (i.e. AMAM/AMPM distortion for the kth stimulus step) may be computed from the following expressions:

$$AMAM(k) = \left| \frac{1}{M} \sum_{m=1}^{M} DC(m,k) - MRx\_DC(m, k=0) \right|$$

$$AMPM(k) = \text{Angle}\left[ \frac{1}{M} \sum_{m=1}^{M} DC(m,k) - MRx\_DC(m, k=0) \right]$$

If desired, the noise-averaged out measurement points from applying Equation 6 can be further smoothed out by using a polynomial fitting (e.g. order=7). This polynomial fitting has the advantage of smoothing out any residual noise in the measured AMAM/AMPM points. Once the AMAM/AMPM distortion is measured, an estimation procedure such as least squares estimation may be used to determine values for digital offset correction, i.e. values for DGain, $DCOC_I$, and $DCOC_Q$.

Note that the goal of this procedure is to determine values of a complex DC offset according to Equation 5 above, which requires estimating the complex DC offset and cascaded analog/RF gain. This may include estimating the following two quantities: $(DC_{Env} + \alpha e^{j\Delta\varphi})$ and RFGain.

Figure 12:
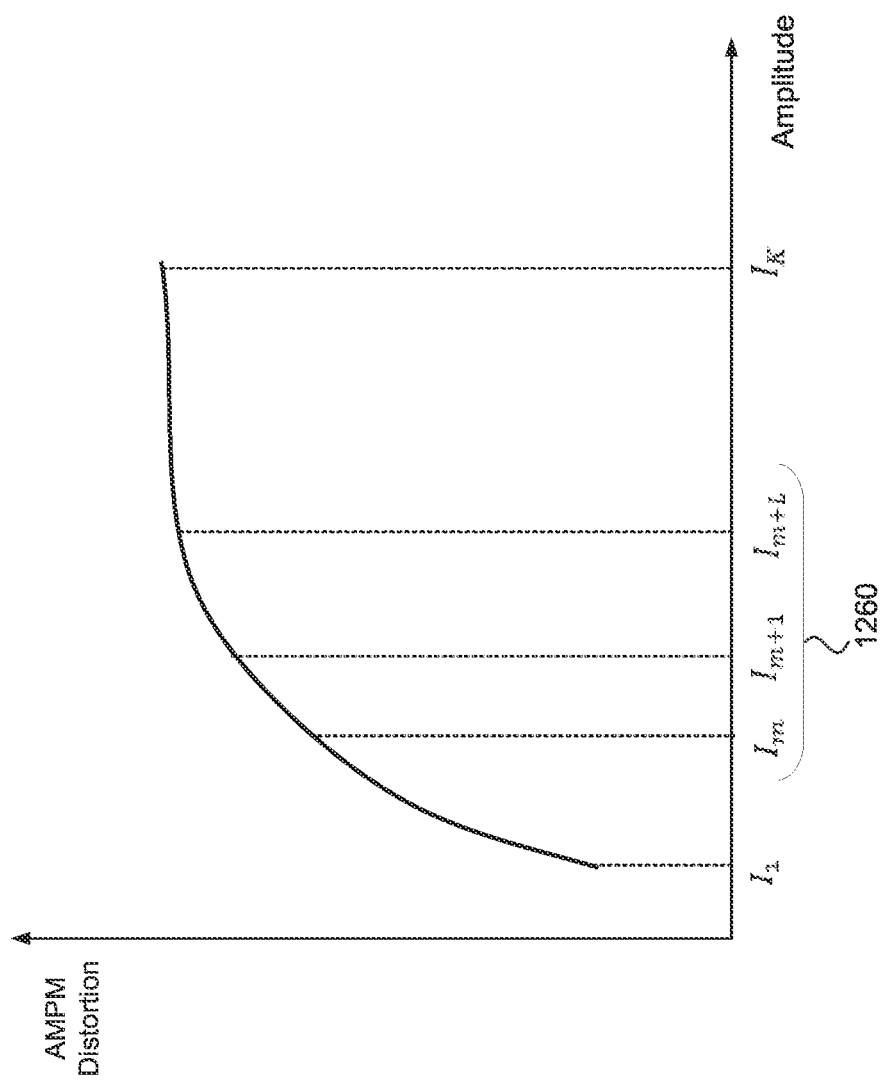
FIG. 12 illustrates an example of AMPM distortion in a transmitter amplifier.

Using a Least Squares (LS) estimation may involve several points k=m, m+1, ..., m+L with m and L both being programmable as illustrated in FIG. 12, i.e. a configurable range 1260 is selected by selecting appropriate values of m and L and configurable range is used for performing LS estimation. FIG. 12 shows AMPM distortion obtained from applying Equation 6 to data that was gathered while applying stimulus during multiple runs, e.g. as shown in FIG. 11, with polynomial fitting for smoothing out residual noise. Typically, to get a more accurate estimate of LO feedthrough in a transmitter (e.g. local oscillator feedthrough 438 in transmitter 402) using a IS fit, more weighing should be given to lower $I_k$ values where LO feedthrough is more dominant (e.g. as illustrated in FIGS. 5A-B).

Due to using the same phase modulated LO from PLL 430 for the transmitter up-conversion in transmitter 402 and measurement receiver down-conversion in measurement receiver 1024 as shown in FIG. 10, the phase modulation information θ(t) can be eliminated when looking at the output of measurement receiver 1024, i.e. at outputs of ADCs 1020, 1022.

Thus, Equation 2 may be rewritten as follows, with θ(t)=0, DGain=1 and $DCOC_I = DCOC_Q = 0$ $$\text{out}(I_k) = e^{j\vartheta}\{RFGain * I_k + DC_{Env} + \alpha e^{j\Delta\varphi}\} = AMAM(k)e^{jAMPM(k)},$$

$$k = m, m+1, \ldots L$$

In matrix format, this can be written as $$\begin{bmatrix} I_m & 1 \\ I_{m+1} & 1 \\ . & . \\ . & . \\ I_{m+L} & 1 \end{bmatrix} \begin{bmatrix} e^{j\vartheta}RFGain \\ e^{j\vartheta}\{DC_{Env} + \alpha e^{j\Delta\varphi}\} \end{bmatrix} = \begin{bmatrix} AMAM(m)e^{jAMPM(m)} \\ AMAM(m+1)e^{jAMPM(m+1)} \\ . \\ . \\ AMAM(m+L)e^{jAMPM(m+L)} \end{bmatrix}$$

(L+1)×2  2×1  (L+1)×1

The LS solution to this matrix system is $$\begin{bmatrix} x_1 \\ x_2 \end{bmatrix} = \begin{bmatrix} e^{j\vartheta}RFGain \\ e^{j\vartheta}\{DC_{Env} + \alpha e^{j\Delta\varphi}\} \end{bmatrix} = \quad \text{(Equation 7)}$$

$$BA^T \begin{bmatrix} AMAM(m)e^{jAMPM(m)} \\ AMAM(m+1)e^{jAMPM(m+1)} \\ . \\ AMAM(M+L)e^{jAMPM(m+L)} \end{bmatrix}$$

Where A^T is a 2×(L+1) transpose matrix of the following matrix:

$$A = \begin{bmatrix} I_m & 1 \\ I_{m+1} & 1 \\ . & . \\ . & . \\ I_{m+L} & 1 \end{bmatrix}$$

and B is a 2×2 matrix given by:

$$B = (A^T A)^{-1}$$

Note that the B matrix can be easily pre-computed and stored in memory. The simple matrix multiplication on the right side of Equation 7 can be carried out in firmware or hardware.

For a given desired RMS output power Pout, Root Mean Square (RMS) voltage, $V_{RMS}$ is given by the following equation:

$$V_{RMS} = \sqrt{0.05 * 10^{\frac{P_{out}}{10}}}$$

Thus digital scaling and complex DC offset corrections are given by the following:

$$DGain = \frac{V_{RMS}}{abs(x_1) * RMS(A(t))}$$

$$DCOC = -\frac{x_2}{x_1}$$

Where A(t) is the magnitude output of the CORDIC and RMS(•) is the root mean square calculation (i.e. the average power of A(t) over time). Note that the quantities $x_1$ and $x_2$ are complex values so that the resulting value for the DC offset correction is a complex digital offset that includes an in-phase offset correction factor and a quadrature offset correction factor. These values can be stored, e.g. in a lookup table, for subsequent use to correct for local oscillator feedthrough in an amplifier (e.g. may be stored in a memory in or coupled to the processor).

Calibration of correction circuits to correct for local oscillator feedthrough of an amplifier in a transmitter may be performed as described above or otherwise to provide a complex digital offset to digitally correct for local oscillator feedthrough of the amplifier, the complex digital offset including an in-phase offset correction factor and a quadrature offset correction factor. The complex digital offset may then be applied, e.g. using one or more CORDIC to apply the digital offset to correct both amplitude and phase of a polar transmitter.

Figure 13:
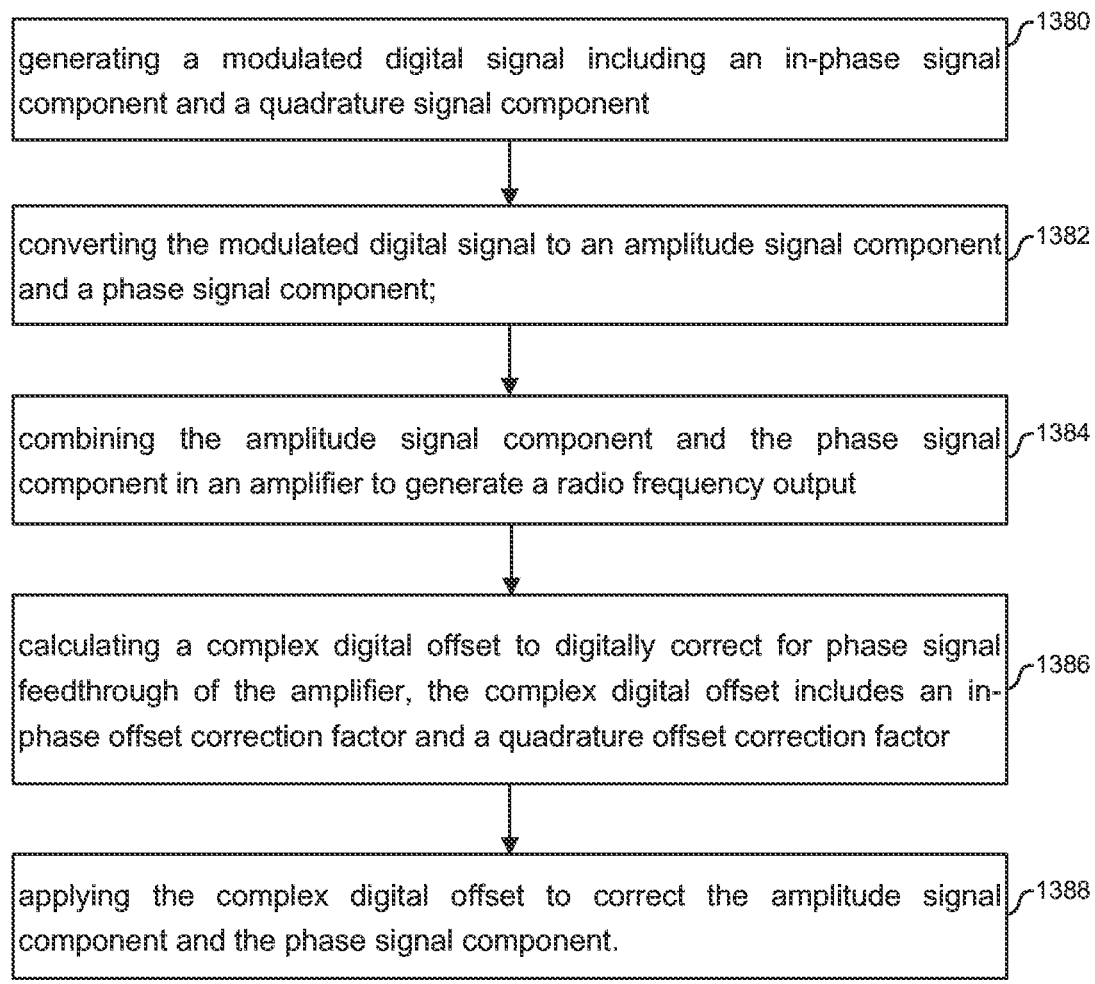
FIG. 13 illustrates an example of a method that includes applying a complex digital offset.

FIG. 13 illustrates an example of using a complex digital offset that includes: generating a modulated digital signal including an in-phase signal component and a quadrature signal component 1380, converting the modulated digital signal to an amplitude signal component and a phase signal component 1382, combining the amplitude signal component and the phase signal component in an amplifier to generate a radio frequency output 1384, and calculating a complex digital offset to digitally correct for local oscillator feedthrough of the amplifier, the complex digital offset includes an in-phase offset correction factor and a quadrature offset correction factor 1386. The method also includes applying the complex digital offset to correct the amplitude signal component and the phase signal component 1388.

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

Although the present disclosure has been described with reference to specific features and embodiments thereof, it is evident that various modifications and combinations can be made thereto without departing from scope of the disclosure. The specification and drawings are, accordingly, to be regarded simply as an illustration of the disclosure as defined by the appended claims, and are contemplated to cover any and all modifications, variations, combinations or equivalents that fall within the scope of the present disclosure. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A circuit comprising:
    a polar transmitter configured to generate a radio frequency output based on an amplitude signal component received at an amplitude input and a phase signal component received at a phase input, the polar transmitter including an amplifier to combine amplitude and phase signal components;
    a processor coupled to the polar transmitter, the processor configured to provide the amplitude signal component to the amplitude input and to provide the phase signal component to the phase input, the processor comprising:
    a digital modulation circuit configured to generate a modulated digital signal including an in-phase signal component and a quadrature signal component for conversion to the amplitude signal component and the phase signal component; and
    a correction circuit configured to calculate a complex digital offset and apply the complex digital offset to correct the amplitude signal component and the phase signal component for local oscillator feedthrough of the amplifier, the complex digital offset includes an in-phase offset correction factor and a quadrature offset correction factor.

2. The circuit of claim 1, wherein the processor includes a first Coordinate Rotation Digital Computer (CORDIC) configured to convert the in-phase signal component and the quadrature signal component to an initial amplitude signal component and an initial phase signal component.

3. The circuit of claim 2, wherein the correction circuit includes a second CORDIC configured to calculate a phase offset to the phase signal component.

4. The circuit of claim 3, wherein the correction circuit further includes a multiplier configured to apply a gain correction factor and an adder configured to apply the in-phase offset correction factor, the multiplier and the adder between the first CORDIC and the second CORDIC.

5. The circuit of claim 1, wherein the processor includes a Coordinate Rotation Digital Computer (CORDIC) configured to convert the in-phase signal component and the quadrature signal component to an initial amplitude signal component and an initial phase signal component in a first clock cycle, and to calculate a phase offset and provide the phase offset to an adder to apply the phase offset to the initial phase signal component to generate the phase signal component in a second clock cycle.

6. The circuit of claim 5, wherein the processor further includes a multiplier and the adder coupled to an output of the CORDIC, the multiplier configured to apply a gain correction factor and the adder to apply the in-phase offset correction factor to the amplitude signal component to generate the output.

7. The circuit of claim 6, wherein the CORDIC is configured to receive the output and generate the amplitude signal component in the second clock cycle.

8. The circuit of claim 1, wherein the correction circuit includes a first Coordinate Rotation Digital Computer (CORDIC) configured to convert the modulated digital signal to a Sine component and a Cosine component, the correction circuit configured to apply correction to the Sine component and the Cosine component and generate a corrected in-phase signal component and a corrected quadrature signal component, the processor includes a second CORDIC configured to convert the corrected in-phase signal component and the corrected quadrature signal component to the amplitude signal component and the phase signal component.

9. The circuit of claim 8, wherein the correction circuit includes a plurality of multipliers including a first multiplier configured to combine the in-phase offset correction factor and the Cosine component, a second multiplier configured to combine the in-phase offset correction factor and the Sine component, a third multiplier configured to combine the quadrature offset correction factor and the Cosine component, a fourth multiplier configured to combine the quadrature offset correction factor and the Sine component, a first adder configured to combine outputs of the first and fourth multipliers, and a second adder configured to combine outputs of the second and third multipliers.

10. The circuit of claim 9, wherein the correction circuit further includes a fifth multiplier configured to combine the in-phase signal component and a gain factor, a third adder configured to combine outputs of the fifth multiplier and the first adder to generate the corrected in-phase signal component, a sixth multiplier configured to combine the quadrature signal component and the gain factor, and a fourth adder configured to combine the output of the sixth multiplier and the second adder to generate the corrected quadrature signal component.

11. A method comprising:
generating a modulated digital signal including an in-phase signal component and a quadrature signal component;
converting the modulated digital signal to an amplitude signal component and a phase signal component;
combining the amplitude signal component and the phase signal component in an amplifier to generate a radio frequency output;
calculating a complex digital offset to digitally correct for local oscillator feedthrough of the amplifier, the complex digital offset includes an in-phase offset correction factor and a quadrature offset correction factor; and
applying the complex digital offset to correct the amplitude signal component and the phase signal component.

12. The method of claim 11, wherein the quadrature offset correction factor is applied by a Coordinate Rotation Digital Computer (CORDIC) generating a phase offset and an adder combining the phase offset with the phase signal component.

13. The method of claim 11, wherein converting the modulated digital signal to the amplitude signal component and the phase signal component is performed by a first CORDIC and the complex digital offset is applied by a second CORDIC coupled to receive the amplitude signal component from the first CORDIC.

14. The method of claim 11, wherein the converting of the modulated digital signal to the amplitude signal component and the phase signal component is performed by a Coordinate Rotation Digital Computer (CORDIC) in a first clock cycle and the quadrature offset correction factor is applied by the CORDIC in a second clock cycle.

15. The method of claim 14, further comprising, in the first clock cycle, applying a gain correction factor and an in-phase correction factor to the amplitude signal component to generate an output, the CORDIC receiving the output and correcting the amplitude signal component in the second clock cycle.

16. The method of claim 11, further comprising:
converting the modulated digital signal including the in-phase signal component and the quadrature signal component to Sine and Cosine components;
applying the complex digital offset to the Sine and Cosine components; and
converting the Sine and Cosine components back to the in-phase signal component and the quadrature signal component.

17. The method of claim 11, wherein converting the modulated digital signal to Sine and Cosine components is performed by a first CORDIC and generating the amplitude signal component and the phase signal component is performed by a second CORDIC.

18. A system comprising:
a polar transmitter formed on a substrate, the polar transmitter configured to generate a radio frequency output from an amplitude signal component received at an amplitude input and a phase signal component received at a phase input, the polar transmitter including a variable gain amplifier configured to combine the amplitude signal component and the phase signal component and a power amplifier configured to amplify output of the variable gain amplifier;
an antenna coupled to receive the radio frequency output from the polar transmitter;
a processor formed on the substrate and coupled to the polar transmitter, the processor configured to provide the amplitude signal component to the amplitude input and to provide the phase signal component to the phase input, the processor including:
a digital modulation circuit configured to generate a modulated digital signal including an initial in-phase signal component and an initial quadrature signal component for conversion to the amplitude signal component and the phase signal component; and
a correction circuit configured to calculate a complex digital offset and apply the complex digital offset to correct the amplitude signal component and the phase signal component for local oscillator feedthrough of the variable gain amplifier, the complex digital offset includes an in-phase offset correction factor and a quadrature offset correction factor.

19. The system of claim 18, further comprising one or more radio frequency receivers formed on the substrate, the one or more radio frequency receivers coupled to the antenna.

20. The system of claim 18, wherein the system is embodied in user equipment to connect with a cellular network.

21. A circuit comprising:
a polar transmitter module configured to generate a radio frequency output from an amplitude signal component received at an amplitude input and a phase signal component received at a phase input, the polar transmitter module including an amplifier configured to combine amplitude and phase signal components;
a processor module coupled to the polar transmitter module, the processor module configured to provide the amplitude signal component to the amplitude input and to provide the phase signal component to the phase input, the processor module comprising:
a modulation module configured to generate a modulated digital signal including an in-phase signal component and a quadrature signal component for conversion to the amplitude signal component and the phase signal component; and
a correction module configured to calculate a complex digital offset and apply the complex digital offset to correct the amplitude signal component and the phase signal component for local oscillator feedthrough of the amplifier, the complex digital offset includes an in-phase offset correction factor and a quadrature offset correction fact.

* * * * *